(12) United States Patent
Nakayama et al.

(10) Patent No.: US 9,963,624 B2
(45) Date of Patent: May 8, 2018

(54) CURABLE COMPOSITION, METHOD FOR PRODUCING CURABLE COMPOSITION, CURED OBJECT, METHOD FOR USING CURABLE COMPOSITION, AND OPTICAL DEVICE

(71) Applicant: LINTEC CORPORATION, Tokyo (JP)

(72) Inventors: Hidekazu Nakayama, Tokyo (JP); Masami Matsui, Tokyo (JP); Mikihiro Kashio, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days. days.

(21) Appl. No.: 15/506,556

(22) PCT Filed: Aug. 21, 2015

(86) PCT No.: PCT/JP2015/073608
§ 371 (c)(1),
(2) Date: Feb. 24, 2017

(87) PCT Pub. No.: WO2016/031730
PCT Pub. Date: Mar. 3, 2016

(65) Prior Publication Data
US 2017/0267904 A1  Sep. 21, 2017

(30) Foreign Application Priority Data

Aug. 26, 2014 (JP) ................................. 2014-171418

(51) Int. Cl.
| | | |
|---|---|---|
| C09J 183/06 | (2006.01) |
| C09J 183/04 | (2006.01) |
| C09J 11/04 | (2006.01) |
| C08K 3/36 | (2006.01) |
| H01L 23/00 | (2006.01) |
| H01L 33/56 | (2010.01) |
| C08L 83/06 | (2006.01) |

(52) U.S. Cl.
CPC ............... *C09J 183/06* (2013.01); *C08K 3/36* (2013.01); *C08L 83/06* (2013.01); *C09J 11/04* (2013.01); *C09J 183/04* (2013.01); *H01L 24/29* (2013.01); *H01L 24/32* (2013.01); *H01L 33/56* (2013.01); *C08K 2201/005* (2013.01); *H01L 2224/2929* (2013.01); *H01L 2224/29387* (2013.01); *H01L 2224/32245* (2013.01); *H01L 2924/10253* (2013.01); *H01L 2924/12041* (2013.01)

(58) Field of Classification Search
CPC ....... C08L 83/04; C08L 83/06; C09D 183/04; C09D 183/06; C09J 183/04; C09J 183/06
USPC ......................................... 524/588; 156/329
See application file for complete search history.

(56) References Cited

U.S. PATENT DOCUMENTS

| | | | | |
|---|---|---|---|---|
| 4,177,175 A | * | 12/1979 | Baney .................. | C09D 183/04 428/412 |
| 5,776,235 A | * | 7/1998 | Camilletti ............. | C04B 41/009 106/287.1 |
| 6,153,689 A | * | 11/2000 | Itoh ........................ | C08G 77/16 524/588 |
| 7,297,731 B2 | * | 11/2007 | Walker, Jr. ............ | C03C 25/104 523/212 |
| 2005/0069718 A1 | | 3/2005 | Voss-Kehl et al. | |
| 2009/0008673 A1 | | 1/2009 | Kato et al. | |
| 2009/0148693 A1 | | 6/2009 | Kumagai | |
| 2010/0025711 A1 | * | 2/2010 | Barnes .................. | F21V 7/0091 257/98 |

(Continued)

FOREIGN PATENT DOCUMENTS

| | | |
|---|---|---|
| EP | 2 915 834 A1 | 9/2015 |
| JP | 2002-9232 A | 1/2002 |

(Continued)

OTHER PUBLICATIONS

International Search Report for PCT/JP2015/073608 (PCT/ISA/210) dated Nov. 24, 2015.
Written Opinion of the International Searching Authority for PCT/JP2015/073608 (PCT/ISA/237) dated Nov. 24, 2015.
International Preliminary Report on Patentability and English translation of Written Opinion dated Feb. 28, 2017, in PCT International Application No. PCT/JP2015/073608.

*Primary Examiner* — Marc S Zimmer
(74) *Attorney, Agent, or Firm* — Birch, Stewart, Kolasch & Birch, LLP

(57) ABSTRACT

The present invention is: a curable composition comprising a component (A), a component (B), and a component (C), the curable composition comprising the component (A) and the component (B) in a mass ratio (component (A):component (B)) of 100:0.3 to 100:50, the component (A) being a curable polysilsesquioxane compound that comprises a repeating unit represented by a formula (a-1), $$R^1SiO_{3/2} \qquad (a\text{-}1)$$

wherein $R^1$ is a substituted or unsubstituted alkyl group having 1 to 10 carbon atoms, or a substituted or unsubstituted aryl group, the component (B) being fine particles having an average primary particle size of 5 to 40 nm, and the component (C) being a silane coupling agent that comprises a sulfur atom in its molecule. This invention provides: a curable composition that produces a cured product that exhibits excellent adhesion, excellent delamination resistance, and excellent heat resistance, and exhibits excellent workability during the application step, a method for producing the same, a cured product obtained by curing the curable composition, a method for using the curable composition as an optical element-securing adhesive or an optical element sealing material, and an optical device.

14 Claims, No Drawings

(56) References Cited

U.S. PATENT DOCUMENTS

| | | |
|---|---|---|
| 2011/0034659 A1 | 2/2011 | Kashio et al. |
| 2011/0054139 A1 | 3/2011 | Kashio et al. |
| 2014/0174321 A1* | 6/2014 | Huang ............... C09D 183/06 106/287.11 |
| 2015/0065663 A1 | 3/2015 | Matsui et al. |
| 2015/0144839 A1* | 5/2015 | Bohmer ............... C08K 3/36 252/301.36 |
| 2017/0190843 A1* | 7/2017 | Rathore ............... C09D 183/04 |
| 2017/0210956 A1* | 7/2017 | Kashio ............... C09J 183/04 |

FOREIGN PATENT DOCUMENTS

| | | |
|---|---|---|
| JP | 2002-313621 A | 10/2002 |
| JP | 2004-359933 A | 12/2004 |
| JP | 2005-263869 A | 9/2005 |
| JP | 2008-328231 A | 12/2006 |
| JP | 2007-507583 A | 3/2007 |
| JP | 2007-112975 A | 5/2007 |
| JP | 2009-138059 A | 6/2008 |
| JP | 2011-173738 A | 9/2011 |
| JP | 5725479 B2 | 5/2015 |
| WO | WO 2009/101753 A1 | 8/2009 |
| WO | WO 2009/104505 A1 | 8/2009 |
| WO | WO 2011/111667 A1 | 9/2011 |
| WO | WO 2013/141360 A1 | 9/2013 |
| WO | WO 2014/069508 A1 | 5/2014 |

* cited by examiner

CURABLE COMPOSITION, METHOD FOR PRODUCING CURABLE COMPOSITION, CURED OBJECT, METHOD FOR USING CURABLE COMPOSITION, AND OPTICAL DEVICE

TECHNICAL FIELD

The present invention relates to a curable composition that produces a cured product that exhibits excellent adhesion, excellent delamination resistance, and excellent heat resistance, and exhibits excellent workability during the application step, a method for producing the same, a cured product obtained by curing the curable composition, a method for using the curable composition as an optical element-securing adhesive or an optical element sealing material, and an optical device.

BACKGROUND ART

A curable composition has been improved in various ways taking account of the application, and is widely used as a raw material, an adhesive, a coating material, and the like that are used to produce optical parts and formed articles.

A curable composition also has attracted attention as an optical element-securing composition (e.g., optical element adhesive and optical element sealing material) that is used when producing a sealed optical element.

Examples of the optical element include a light-emitting element (e.g., laser (e.g., semiconductor laser diode (LD)) and light-emitting diode (LED)), a light-receiving element, a hybrid optical element, an optical integrated circuit, and the like.

In recent years, an optical element that emits blue light or white light (i.e., an optical element that has a shorter emission peak wavelength) has been developed, and is widely used. There has been a tendency that an optical element having a short emission peak wavelength generates a larger amount of heat along with a rapid increase in brightness.

Along with a recent increase in the brightness of an optical element, a cured product of an optical element-securing composition may deteriorate due to long-term exposure to high-energy light or high-temperature heat generated by such an optical element, whereby delamination or a decrease in adhesion may occur.

In order to solve the above problem, Patent Literature 1 to 3 propose an optical element-securing composition that includes a polysilsesquioxane compound as the main component, and Patent Literature 4 proposes a semiconductor light-emitting device member and the like that utilize a hydrolysis-polycondensation product of a silane compound.

However, the compositions and the cured product (e.g., member) disclosed in Patent Literature 1 to 4 may not exhibit sufficient delamination resistance and heat resistance while maintaining sufficient adhesion.

A coating (application) device having a discharge tube (needle) (see Patent Literature 5) is normally used to apply a curable composition in order to secure an optical element or the like. Such a coating device having a discharge tube is designed so that the discharge tube moves vertically downward to approach the coating target, discharges a specific amount of curable composition from the end thereof, and moves upward so as to move away from the coating target while the coating target moves sideways. The curable composition can be continuously and efficiently applied by repeating this operation.

However, when a curable composition having high viscosity is used, for example, the curable composition that has been discharged from the discharge tube may not break, and may string (i.e., stringing phenomenon) when the discharge tube moves upward. If the coating target moves sideways in a state in which the curable composition has stringed, the curable composition may adhere to the coating target in an area other than the intended application target area (i.e., resin paste bridge may occur), whereby the coating target may be contaminated.

This problem can be solved by decreasing the viscosity of the curable composition. In this case, however, since the curable composition that has been discharged easily spreads, the coating target may be contaminated.

Therefore, development of a curable composition that produces a cured product that exhibits excellent adhesion, excellent delamination resistance, and excellent heat resistance, and can be continuously (successively) applied without contaminating the coating target (i.e., exhibits excellent workability during the application step), has been desired.

CITATION LIST

Patent Literature

Patent Literature 1: JP-A-2004-359933
Patent Literature 2: JP-A-2005-263869
Patent Literature 3: JP-A-2006-328231
Patent Literature 4: JP-A-2007-112975 (US2009008673A1)
Patent Literature 5: JP-A-2002-009232

SUMMARY OF INVENTION

Technical Problem

The invention was conceived in view of the above situation. An object of the invention is to provide a curable composition that produces a cured product that exhibits excellent adhesion, excellent delamination resistance, and excellent heat resistance, and exhibits excellent workability during the application step, a method for producing the same, a cured product obtained by curing the curable composition, a method for using the curable composition as an optical element-securing adhesive or an optical element sealing material, and an optical device.

Solution to Problem

The inventors conducted extensive studies in order to solve the above problem. As a result, the inventors found that a curable composition that includes a specific curable polysilsesquioxane compound, fine particles having a specific average primary particle size, and a specific silane coupling agent, and includes the curable polysilsesquioxane compound and the fine particles in a ratio within a specific range, produces a cured product that exhibits excellent adhesion, excellent delamination resistance, and excellent heat resistance, and exhibits excellent workability during the application step. This finding has led to the completion of the invention.

Several aspects of the invention provide the following curable composition (see (1) to (8)), method for producing a curable composition (see (9)), cured product (see (10) and (11)), method for using a curable composition (see (12) and (13)), and optical device (see (14)).

(1) A curable composition including a component (A), a component (B), and a component (C), the curable composition including the component (A) and the component (B) in a mass ratio (component (A):component (B)) of 100:0.3 to 100:50, the component (A) being a curable polysilsesquioxane compound that includes a repeating unit represented by a formula (a-1), $$R^1SiO_{3/2} \quad (a-1)$$

wherein $R^1$ is a substituted or unsubstituted alkyl group having 1 to 10 carbon atoms, or a substituted or unsubstituted aryl group, the component (B) being fine particles having an average primary particle size of 5 to 40 nm, and the component (C) being a silane coupling agent that includes a sulfur atom in its molecule.

(2) The curable composition according to (1), wherein the curable polysilsesquioxane compound that is used as the component (A) has a mass average molecular weight (Mw) of 800 to 30,000.

(3) The curable composition according to (1), wherein the curable polysilsesquioxane compound that is used as the component (A) is a curable polysilsesquioxane compound obtained by subjecting at least one compound represented by a formula (a-2) to polycondensation in the presence of a polycondensation catalyst, $$R^1Si(OR^2)_x(X^1)_{3-x} \quad (a-2)$$

wherein $R^1$ is the same as defined above, $R^2$ is an alkyl group having 1 to 10 carbon atoms, $X^1$ is a halogen atom, and x is an integer from 0 to 3, provided that a plurality of $R^2$ are either identical to or different from each other when a plurality of $R^2$ are present, and a plurality of $X^1$ are either identical to or different from each other when a plurality of $X^1$ are present.

(4) The curable composition according to (1), wherein the component (B) is at least one type of fine particles selected from the group consisting of silica, a metal oxide, and a mineral.

(5) The curable composition according to (1), including the component (A) and the component (C) in a mass ratio (component (A):component (C)) of 100:0.1 to 100:50.

(6) The curable composition according to (1), further including a diluent.

(7) The curable composition according to (6), including the component (A), the component (B), and the component (C) in a total ratio of 50 to 100 mass % based on the total amount of components included in the curable composition excluding the diluent.

(8) The curable composition according to (6), having a solid content of 50 mass % or more and less than 100 mass %.

(9) A method for producing the curable composition according to (1), including:

a step (I) that subjects at least one compound represented by a formula (a-2) to polycondensation in the presence of a polycondensation catalyst to obtain the curable polysilsesquioxane compound, $$R^1Si(OR^2)_x(X^1)_{3-x} \quad (a-2)$$

wherein $R^1$ is the same as defined above, $R^2$ is an alkyl group having 1 to 10 carbon atoms, $X^1$ is a halogen atom, and x is an integer from 0 to 3, provided that a plurality of $R^2$ are either identical to or different from each other when a plurality of $R^2$ are present, and a plurality of $X^1$ are either identical to or different from each other when a plurality of $X^1$ are present; and a step (II) that mixes the curable polysilsesquioxane compound obtained by the step (I), the component (B), and the component (C).

(10) A cured product obtained by curing the curable composition according to (1).

(11) The cured product according to (10), the cured product being an optical element-securing material.

(12) A method for using the curable composition according to (1) as an optical element-securing adhesive.

(13) A method for using the curable composition according to (1) as an optical element sealing material.

(14) An optical device produced using the curable composition according to (1) as an optical element-securing adhesive or an optical element sealing material.

Advantageous Effects of Invention

The curable composition according to one aspect of the invention produces a cured product that exhibits excellent adhesion, excellent delamination resistance, and excellent heat resistance, and exhibits excellent workability during the application step.

The curable composition according to one aspect of the invention may suitably be used as an optical element-securing adhesive and an optical element sealing material.

The cured product according to one aspect of the invention exhibits excellent heat resistance and high adhesion.

DESCRIPTION OF EMBODIMENTS

A curable composition, a method for producing the same, a cured product, a method for using a curable composition, and an optical device according to the exemplary embodiments of the invention are described in detail below.

1) Curable Composition

A curable composition according to one embodiment of the invention includes a component (A), a component (B), and a component (C), the curable composition including the component (A) and the component (B) in a mass ratio (component (A):component (B)) of 100:0.3 to 100:50, the component (A) being a curable polysilsesquioxane compound that includes a repeating unit represented by the following formula (a-1), $$R^1SiO_{3/2} \quad (a-1)$$

wherein $R^1$ is a substituted or unsubstituted alkyl group having 1 to 10 carbon atoms, or a substituted or unsubstituted aryl group, the component (B) being fine particles having an average primary particle size of 5 to 40 nm, and the component (C) being a silane coupling agent that includes a sulfur atom in its molecule.

Component (A)

The component (A) included in the curable composition according to one embodiment of the invention is the curable polysilsesquioxane compound that includes the repeating unit represented by the formula (a-1) (hereinafter may be referred to as "silane compound polymer (A)").

$R^1$ in the formula (a-1) is a substituted or unsubstituted alkyl group having 1 to 10 carbon atoms, or a substituted or unsubstituted aryl group.

Examples of the alkyl group having 1 to 10 carbon atoms that may be represented by $R^1$ include a methyl group, an ethyl group, an n-propyl group, an isopropyl group, an n-butyl group, an isobutyl group, an s-butyl group, a t-butyl group, an n-pentyl group, an n-hexyl group, an n-octyl group, an n-nonyl group, and the like. Among these, an alkyl group having 1 to 6 carbon atoms is preferable, and an alkyl group having 1 to 3 carbon atoms is more preferable.

Examples of the substituent when $R^1$ is a substituted alkyl group having 1 to 10 carbon atoms include a halogen atom (e.g., fluorine atom, chlorine atom, bromine atom, and iodine atom); a cyano group; and a group represented by OG.

G is a protecting group for a hydroxy group. The protecting group for a hydroxy group is not particularly limited. The protecting group for a hydroxy group may be an arbitrary protecting group that is known as a protecting group for a hydroxy group. Examples of the protecting group for a hydroxy group include an acyl-based protecting group; a silyl-based protecting group such as a trimethylsilyl group, a triethylsilyl group, a t-butyldimethylsilyl group, and a t-butyldiphenylsilyl group; an acetal-based protecting group such as a methoxymethyl group, a methoxyethoxymethyl group, a 1-ethoxyethyl group, a tetrahydropyran-2-yl group, and a tetrahydrofuran-2-yl group; an alkoxycarbonyl-based protecting group such as a t-butoxycarbonyl group; an ether-based protecting group such as a methyl group, an ethyl group, a t-butyl group, an octyl group, an allyl group, a triphenylmethyl group, a benzyl group, a p-methoxybenzyl group, a fluorenyl group, a trityl group, and a benzhydryl group; and the like. It is preferable that G be an acyl-based protecting group.

The acyl-based protecting group is a group represented by —C(=O)R (wherein R is an alkyl group having 1 to 6 carbon atoms (e.g., methyl group, ethyl group, n-propyl group, isopropyl group, n-butyl group, isobutyl group, s-butyl group, t-butyl group, or n-pentyl group), or a substituted or unsubstituted phenyl group).

Examples of the substituent when R is a substituted phenyl group include an alkyl group such as a methyl group, an ethyl group, an n-propyl group, an isopropyl group, an n-butyl group, an s-butyl group, an isobutyl group, a t-butyl group, an n-pentyl group, an n-hexyl group, an n-heptyl group, an n-octyl group, and an isooctyl group; a halogen atom such as a fluorine atom, a chlorine atom, and a bromine atom; an alkoxy group such as a methoxy group and an ethoxy group; and the like.

Examples of the aryl group that may be represented by $R^1$ include a phenyl group, a 1-naphthyl group, a 2-naphthyl group, and the like.

Examples of the substituent when $R^1$ is a substituted aryl group include an alkyl group such as a methyl group, an ethyl group, an n-propyl group, an isopropyl group, an n-butyl group, an s-butyl group, an isobutyl group, a t-butyl group, an n-pentyl group, an n-hexyl group, an n-heptyl group, an n-octyl group, and an isooctyl group; a halogen atom such as a fluorine atom, a chlorine atom, and a bromine atom; an alkoxy group such as a methoxy group and an ethoxy group; and the like.

It is preferable that $R^1$ be a substituted or unsubstituted alkyl group having 1 to 10 carbon atoms, more preferably a substituted or unsubstituted alkyl group having 1 to 6 carbon atoms, and still more preferably a substituted or unsubstituted alkyl group having 1 to 3 carbon atoms, since a curable composition that produces a cured product that exhibits better heat resistance and adhesion is easily obtained.

The repeating unit represented by the formula (a-1) is normally referred to as "T-site", and has a structure in which three oxygen atoms and one group ($R^1$) are bonded to the silicon atom.

Specific examples of the structure of the T-site include structures respectively represented by the following formulas (a-3) to (a-5).

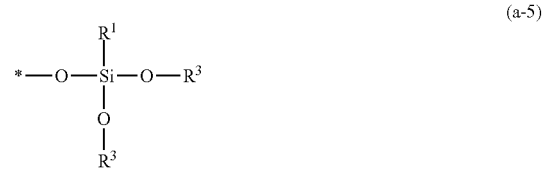

$R^1$ in the formulas (a-3) to (a-5) is the same as defined above. $R^3$ is a hydrogen atom or an alkyl group having 1 to 10 carbon atoms. Examples of the alkyl group having 1 to 10 carbon atoms that may be represented by $R^3$ include a methyl group, an ethyl group, an n-propyl group, an isopropyl group, an n-butyl group, an s-butyl group, an isobutyl group, a t-butyl group, and the like. Note that a plurality of $R^3$ are either identical to or different from each other. The symbol "*" in the formulas (a-3) to (a-5) represents that an Si atom is bonded.

The silane compound polymer (A) is soluble in various organic solvents including a ketone-based solvent such as acetone, an aromatic hydrocarbon-based solvent such as benzene, a sulfur-containing solvent such as dimethyl sulfoxide, an ether-based solvent such as tetrahydrofuran, an ester-based solvent such as ethyl acetate, a halogen-containing solvent such as chloroform, a mixed solvent including two or more solvents among these solvents, and the like. The silane compound polymer (A) can be subjected to $^{29}$Si-NMR measurement in a solution state using these solvents.

For example, when the silane compound polymer (A) in which $R^1$ is a methyl group is subjected to $^{29}$Si-NMR measurement in a solution state, a peak (T3) that is attributed to the silicon atom included in the structure represented by the formula (a-3) is observed within a region of −70 ppm or more and less than −61 ppm, a peak (T2) that is attributed to the silicon atom included in the structure represented by the formula (a-4) is observed within a region of −60 ppm or more and less than −54 ppm, and a peak (T1) that is attributed to the silicon atom included in the structure represented by the formula (a-5) is observed within a region of −53 ppm or more and less than −45 ppm.

The silane compound polymer (A) is preferably characterized in that the integral value of the peak T3 is 60 to 90% with respect to the sum of the integral value of the peak T1, the integral value of the peak T2, and the integral value of the peak T3.

The content of the repeating unit represented by the formula (a-1) in the silane compound polymer (A) is preferably 40 mass % or more, more preferably 70 mass % or more, still more preferably 90 mass % or more, and particularly preferably 100 mass %, based on the total amount of repeating units included in the silane compound polymer (A).

The content of the repeating unit represented by the formula (a-1) in the silane compound polymer (A) can be determined by subjecting the silane compound polymer (A) to $^{29}$Si-NMR measurement, for example.

The silane compound polymer (A) may be a homopolymer that includes only one type of $R^1$, or may be a copolymer that includes two or more types of $R^1$.

When the silane compound polymer (A) is a copolymer, the silane compound polymer (A) may be a random copolymer, a block copolymer, a graft copolymer, an alternating copolymer, or the like. In this case, it is preferable that the silane compound polymer (A) be a random copolymer from the viewpoint of ease of production and the like.

The silane compound polymer (A) may have a ladder-like structure, a double decker-like structure, a basket-like structure, a partially cleaved basket-like structure, a cyclic structure, or a random structure.

The mass average molecular weight (Mw) of the silane compound polymer (A) is normally 800 to 30,000, preferably 1,000 to 20,000, and more preferably 1,200 to 10,000. When the mass average molecular weight (Mw) of the silane compound polymer (A) is within the above range, it is possible to easily obtain a curable composition that produces a cured product that exhibits excellent adhesion, excellent delamination resistance, and excellent heat resistance, and exhibits excellent workability during the application step.

The molecular weight distribution (Mw/Mn) of the silane compound polymer (A) is not particularly limited, but is normally 1.0 to 10.0, and preferably 1.1 to 6.0. When the molecular weight distribution (Mw/Mn) of the silane compound polymer (A) is within the above range, a cured product that exhibits better adhesion and heat resistance is easily obtained.

The mass average molecular weight (Mw) and the number average molecular weight (Mn) may be determined as standard polystyrene-equivalent values by gel permeation chromatography (GPC) (eluent: tetrahydrofuran (THF)), for example.

These silane compound polymers (A) may be used either alone or in combination.

The silane compound polymer (A) may be produced using an arbitrary method. For example, the silane compound polymer (A) can be produced by subjecting at least one silane compound (1) represented by the following formula (a-2) to polycondensation.

$$R^1Si(OR^2)_x(X^1)_{3-x} \qquad (a-2)$$

wherein $R^1$ is the same as defined above, $R^2$ is an alkyl group having 1 to 10 carbon atoms, $X^1$ is a halogen atom, and x is an integer from 0 to 3, provided that a plurality of $R^2$ are either identical to or different from each other when a plurality of $R^2$ are present, and a plurality of $X^1$ are either identical to or different from each other when a plurality of $X^1$ are present.

Examples of the alkyl group having 1 to 10 carbon atoms that is represented by $R^2$ include those mentioned above in connection with the alkyl group having 1 to 10 carbon atoms that may be represented by $R^3$.

Examples of the halogen atom that is represented by $X^1$ include a chlorine atom, a bromine atom, and the like.

Specific examples of the silane compound (1) include an alkyltrialkoxysilane compound such as methyltrimethoxysilane, methyltriethoxysilane, ethyltrimethoxysilane, ethyltriethoxysilane, ethyltripropoxysilane, n-propyltrimethoxysilane, n-propyltriethoxysilane, n-propyltripropoxysilane, n-propyltributoxysilane, n-butyltrimethoxysilane, isobutyltrimethoxysilane, n-pentyltrimethoxysilane, n-hexyltrimethoxysilane, and isooctyltriethoxysilane;

an alkylhalogenoalkoxysilane compound such as methylchlorodimethoxysilane, methylchlorodiethoxysilane, methyldichloromethoxysilane, methylbromodimethoxysilane, ethylchlorodimethoxysilane, ethylchlorodiethoxysilane, ethyldichloromethoxysilane, ethylbromodimethoxysilane, n-propylchlorodimethoxysilane, n-propyldichloromethoxysilane, n-butylchlorodimethoxysilane, and n-butyldichloromethoxysilane;

an alkyltrihalogenosilane compound such as methyltrichlorosilane, methyltribromosilane, ethyltrichlorosilane, ethyltribromosilane, n-propyltrichlorosilane, n-propyltribromosilane, n-butyltrichlorosilane, isobutyltrichlorosilane, n-pentyltrichlorosilane, n-hexyltrichlorosilane, and isooctyltrichlorosilane; and the like.

An alkyltrialkoxysilane compound is preferable as the silane compound (1) since a curable composition that produces a cured product that exhibits better adhesion can be obtained.

These silane compounds (1) may be used either alone or in combination.

The silane compound (1) may be subjected to polycondensation using an arbitrary method. For example, the silane compound (1) may be subjected to polycondensation by adding a specific amount of a polycondensation catalyst to the silane compound (1) in the presence or absence of a solvent, and stirring the mixture at a specific temperature. More specifically, the silane compound (1) may be subjected to polycondensation using a method (a) that adds a specific amount of an acid catalyst to the silane compound (1), and stirs the mixture at a specific temperature, a method (b) that adds a specific amount of a base catalyst to the silane compound (1), and stirs the mixture at a specific temperature, a method (c) that adds a specific amount of an acid catalyst to the silane compound (1), stirs the mixture at a specific temperature, adds an excess amount of a base catalyst to the mixture so that the reaction system becomes basic, and stirs the mixture at a specific temperature, or the like. It is preferable to use the method (a) or (c) since the desired silane compound polymer (A) can be efficiently obtained.

An acid catalyst or a base catalyst may be used as the polycondensation catalyst. It is also possible to use two or more polycondensation catalysts in combination. Note that it is preferable to use at least an acid catalyst.

Examples of the acid catalyst include an inorganic acid such as phosphoric acid, hydrochloric acid, boric acid, sulfuric acid, and nitric acid; an organic acid such as citric acid, acetic acid, methanesulfonic acid, trifluoromethanesulfonic acid, benzenesulfonic acid, and p-toluenesulfonic acid; and the like. It is preferable to use at least one compound selected from phosphoric acid, hydrochloric acid, boric acid, sulfuric acid, citric acid, acetic acid, and methanesulfonic acid.

Examples of the base catalyst include aqueous ammonia; an organic base such as trimethylamine, triethylamine, lithium diisopropylamide, lithium bis(trimethylsilyl)amide, pyridine, 1,8-diazabicyclo[5.4.0]-7-undecene, aniline, picoline, 1,4-diazabicyclo[2.2.2]octane, and imidazole; an organic base hydroxide such as tetramethylammonium hydroxide and tetraethylammonium hydroxide; a metal alkoxide such as sodium methoxide, sodium ethoxide, sodium t-butoxide, and potassium t-butoxide; a metal hydride such as sodium hydride and calcium hydride; a metal hydroxide such as sodium hydroxide, potassium hydroxide, and calcium hydroxide; a metal carbonate such as sodium carbonate, potassium carbonate, and magnesium carbonate; a metal hydrogen carbonate such as sodium hydrogen carbonate and potassium hydrogen carbonate; and the like.

The polycondensation catalyst is normally used in a ratio of 0.05 to 10 mol %, and preferably 0.1 to 5 mol %, based on the total number of moles of the silane compound (1).

When a solvent is used, the solvent may be appropriately selected taking account of the type of silane compound (1) and the like. Examples of the solvent include water; an aromatic hydrocarbon such as benzene, toluene, and xylene; an ester such as methyl acetate, ethyl acetate, propyl acetate, butyl acetate, and methyl propionate; a ketone such as acetone, methyl ethyl ketone, methyl isobutyl ketone, and cyclohexanone; an alcohol such as methyl alcohol, ethyl alcohol, n-propyl alcohol, isopropyl alcohol, n-butyl alcohol, isobutyl alcohol, s-butyl alcohol, and t-butyl alcohol; and the like. These solvents may be used either alone or in combination. When the method (c) is used, a polycondensation reaction may be effected in an aqueous system in the presence of the acid catalyst, an organic solvent and an excess amount of the base catalyst (e.g., aqueous ammonia) may be added to the reaction mixture, and a polycondensation reaction may be effected under basic conditions.

The solvent is used in an amount of 0.1 to 10 l, and preferably 0.1 to 2 l, based on 1 mol of the silane compound (1).

The silane compound (1) is normally subjected to polycondensation at a temperature from 0° C. to the boiling point of the solvent, and preferably 20 to 100° C. If the reaction temperature is too low, the polycondensation reaction may not sufficiently proceed. If the reaction temperature is too high, it may be difficult to suppress gelation. The reaction is normally completed within 30 minutes to 20 hours.

After completion of the reaction, the reaction solution is neutralized by adding an aqueous solution that includes an alkali (e.g., sodium hydrogen carbonate) to the reaction solution when the acid catalyst is used, or neutralized by adding an acid (e.g., hydrochloric acid) to the reaction solution when the base catalyst is used. Salts produced during neutralization are removed by filtration, washing with water, or the like to obtain the desired silane compound polymer (A).

When the silane compound polymer (A) is produced using the above method, $OR^2$ or $X^1$ included in the silane compound (1) remains in the silane compound polymer (A) when $OR^2$ or $X^1$ has not been subjected to dealcoholization or the like. Therefore, the silane compound polymer (A) may include the repeating unit represented by the formula (a-4) and the repeating unit represented by the formula (a-5) in addition to the repeating unit represented by the formula (a-3).

Component (B)

The component (B) included in the curable composition according to one embodiment of the invention is fine particles having an average primary particle size of 5 to 40 nm.

The curable composition that includes the component (B) exhibits excellent workability during the application step.

The average primary particle size of the fine particles is preferably 5 to 30 nm, and more preferably 5 to 20 nm. When the average primary particle size of the fine particles is within the above range, it is possible to obtain a curable composition that exhibits excellent workability during the application step.

The average primary particle size of the fine particles can be determined by observing the shape of the fine particles using a transmission electron microscope.

The specific surface area of fine particles used as the component (B) is preferably 10 to 500 $m^2/g$, and more preferably 20 to 300 $m^2/g$. When the specific surface area of the fine particles is within the above range, it is possible to easily obtain a curable composition that exhibits better workability during the application step.

The specific surface area of fine particles can be determined using a BET multipoint method.

The fine particles may have a spherical shape, a chain-like shape, a needle-like shape, a plate-like shape, a flaky shape, a rod-like shape, a fibrous shape, or the like. It is preferable that the fine particles have a spherical shape. The term "spherical shape" used herein refers to a spherical shape, and an approximately spherical shape including a polyhedral shape that can be approximated to a sphere, such as a spheroidal shape, an oval shape, a konpeito-like shape, and a cocoon-like shape.

The fine particles may be formed of an arbitrary component. Examples of such a component include a metal; a metal oxide; a mineral; a metal carbonate such as calcium carbonate and magnesium carbonate; a metal sulfate such as calcium sulfate and barium sulfate; a metal hydroxide such as aluminum hydroxide; a metal silicate such as aluminum silicate, calcium silicate, and magnesium silicate; an inorganic component such as silica; an organic component such as an acrylic-based polymer; and the like.

The fine particles may have been surface-modified.

The term "metal" used herein refers to the elements that respectively belong to Group 1 (excluding H), Groups 2 to 11, Group 12 (excluding Hg), Group 13 (excluding B), Group 14 (excluding C and Si), Group 15 (excluding N, P, As, and Sb), and Group 16 (excluding O, S, Se, Te, and Po) in the periodic table.

Examples of the silica include dry silica, wet silica, and the like.

Examples of the metal oxide include titanium oxide, alumina, boehmite, chromium oxide, nickel oxide, copper oxide, titanium oxide, zirconium oxide, indium oxide, zinc oxide, a complex oxide thereof, and the like. The metal oxide fine particles may be sol particles that include these metal oxides.

Examples of the mineral include a smectite, a bentonite, and the like.

Examples of the smectite include montmorillonite, beidellite, hectorite, saponite, stevensite, nontronite, sauconite, and the like.

These fine particles may be used either alone or in combination.

Among these, silica, a metal oxide, and a mineral are preferable, and silica is more preferable, since a cured product that exhibits excellent transparency is easily obtained.

It is preferable to use surface-modified silica, and more preferably hydrophobic surface-modified silica, since a curable composition that exhibits better workability during the application step is easily obtained.

Examples of the hydrophobic surface-modified silica include silica having a structure in which an alkylsilyl group having 1 to 20 carbon atoms (e.g., trimethylsilyl group), a dialkylsilyl group having 1 to 20 carbon atoms (e.g., dimethylsilyl group), or an alkylsilyl group having 1 to 20 carbon atoms (e.g., octylsilyl group) is bonded to the surface thereof; silica that has been surface-modified with a silicone oil; and the like.

The component (B) is used in such an amount that the curable composition includes the component (A) and the component (B) in a mass ratio (component (A):component (B)) of 100:0.3 to 100:50, preferably 100:0.5 to 100:40, and more preferably 100:0.8 to 100:30. If the component (B) is used in such an amount that the curable composition includes the component (A) and the component (B) in a mass ratio that is less than the above range, the desired delamination resistance may not be obtained. If the component (B) is used in such an amount that the curable composition includes the component (A) and the component (B) in a mass ratio that exceeds the above range, a decrease in adhesion may occur.

The component (C) included in the curable composition according to one embodiment of the invention is a silane coupling agent that includes a nitrogen atom in its molecule (hereinafter may be referred to as "silane coupling agent (C)").

The curable composition that includes the component (C) exhibits excellent workability during the application step, and produces a cured product that exhibits excellent adhesion, excellent delamination resistance, and excellent heat resistance.

The sulfur atom is normally included in a monovalent or divalent sulfur atom-containing group.

Examples of the sulfur atom-containing group include a monovalent sulfur atom-containing group such as a thiol group (—SH) and an acylthio group (—S—CO—R'); a divalent sulfur atom-containing group such as a sulfide group (—S—), and a polysulfide group (—(S)n-) such as a disulfide group (—S—S—) and a tetrasulfide group (—S—S—S—S—); and the like.

Examples of the silane coupling agent (C) include silane coupling agents respectively represented by the following formulas (c-1) to (c-4), other silane coupling agents that include a sulfur atom-containing functional group, oligomers thereof, and the like.

$(Y^1)_3Si-A^1-SH$          (c-1)

$(Y^1)_3Si-A^1-S-CO-R'$          (c-2)

$(Y^1)_3Si-A^1-S-Si(Y^2)_3$          (c-3)

$(Y^1)_3Si-A^1-(S)_v-A^2-Si(Y^2)_3$          (c-4)

wherein $Y^1$ and $Y^2$ are independently an alkoxy group having 1 to 10 carbon atoms, $A^1$ and $A^2$ are independently a substituted or unsubstituted divalent hydrocarbon group having 1 to 20 carbon atoms, R' is a monovalent organic group having 1 to 20 carbon atoms, and v is an integer from 1 to 4, provided that a plurality of $Y^1$ are either identical to or different from each other, and a plurality of $Y^2$ are either identical to or different from each other.

Examples of the alkoxy group having 1 to 10 carbon atoms represented by $Y^1$ and $Y^2$ include a methoxy group, an ethoxy group, an n-propoxy group, an isopropoxy group, an n-butoxy group, an s-butoxy group, an isobutoxy group, a t-butoxy group, and the like.

$Y^1$ and $Y^2$ are preferably an alkoxy group having 1 to 6 carbon atoms.

Examples of the substituted or unsubstituted divalent hydrocarbon group having 1 to 20 carbon atoms represented by $A^1$ and $A^2$ include an alkylene group having 1 to 20 carbon atoms, an alkenylene group having 2 to 20 carbon atoms, an alkynylene group having 2 to 20 carbon atoms, an arylene group having 6 to 20 carbon atoms, a divalent group having 7 to 20 carbon atoms obtained by combining an alkylene group, an alkenylene group, or an alkynylene group with an arylene group, and the like.

Examples of the alkylene group having 1 to 20 carbon atoms include a methylene group, an ethylene group, a propylene group, a trimethylene group, a tetramethylene group, a pentamethylene group, a hexamethylene group, and the like.

Examples of the alkenylene group having 2 to 20 carbon atoms include a vinylene group, a propenylene group, a butenylene group, a pentenylene group, and the like.

Examples of the alkynylene group having 2 to 20 carbon atoms include an ethynylene group, a propynylene group, and the like.

Examples of the arylene group having 6 to 20 carbon atoms include an o-phenylene group, an m-phenylene group, a p-phenylene group, a 2,6-naphthylene group, and the like.

Examples of a substituent that may substitute the alkylene group having 1 to 20 carbon atoms, the alkenylene group having 2 to 20 carbon atoms, and the alkynylene group having 2 to 20 carbon atoms include a halogen atom such as a fluorine atom and a chlorine atom; an alkoxy group such as a methoxy group and an ethoxy group; an alkoxycarbonyl group such as a methoxycarbonyl group and an ethoxycarbonyl group; and the like.

Examples of a substituent that may substitute the arylene group having 6 to 20 carbon atoms include a cyano group; a nitro group; a halogen atom such as a fluorine atom, a chlorine atom, and a bromine atom; an alkyl group such as a methyl group and an ethyl group; an alkoxy group such as a methoxy group and an ethoxy group; and the like.

These substituents may be bonded to the alkylene group, the alkenylene group, the alkynylene group, and the arylene group at an arbitrary position. A plurality of identical or different substituents may be bonded to the alkylene group, the alkenylene group, the alkynylene group, and the arylene group.

Examples of the divalent group obtained by combining a substituted or unsubstituted alkylene group, a substituted or unsubstituted alkenylene group, or a substituted or unsubstituted alkynylene group with a substituted or unsubstituted arylene group, include a group in which at least one group among a substituted or unsubstituted alkylene group, a substituted or unsubstituted alkenylene group, and a substituted or unsubstituted alkynylene group is linearly bonded to at least one substituted or unsubstituted arylene group, and the like. Specific examples of the divalent group include the groups respectively represented by the following formulas, and the like.

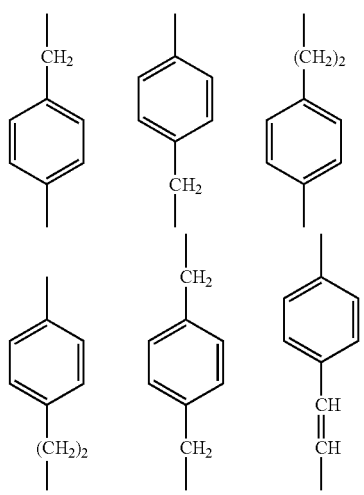

A$^1$ and A$^2$ are preferably an alkylene group having 1 to 4 carbon atoms (e.g., methylene group, ethylene group, propylene group, trimethylene group, or tetramethylene group).

R' is not particularly limited as long as —CO—R' can function as a protecting group. Examples of R' include an alkyl group such as a methyl group, an ethyl group, an n-propyl group, an isopropyl group, an n-butyl group, an isobutyl group, an s-butyl group, a t-butyl group, an n-pentyl group, an n-hexyl group, an n-heptyl group, an n-octyl group, an n-nonyl group, an n-decyl group, an n-undecyl group, and an n-dodecyl group; a substituted or unsubstituted phenyl group; and the like.

Examples of the substituent when R' is a substituted phenyl group include an alkyl group such as a methyl group, an ethyl group, an n-propyl group, an isopropyl group, an n-butyl group, an s-butyl group, an isobutyl group, a t-butyl group, an n-pentyl group, and an n-hexyl group; a halogen atom such as a fluorine atom, a chlorine atom, and a bromine atom; an alkoxy group such as a methoxy group and an ethoxy group; and the like.

R' is preferably an alkyl group having 1 to 20 carbon atoms, and more preferably an alkyl group having 1 to 10 carbon atoms.

v is an integer from 1 to 4, preferably 1, 2, or 4, and more preferably 2 or 4.

Examples of the silane coupling agent represented by the formula (c-1) include a mercaptoalkyltrialkoxysilane such as mercaptomethyltrimethoxysilane, mercaptomethyltriethoxysilane, mercaptomethyltripropoxysilane, 2-mercaptoethyltrimethoxysilane, 2-mercaptoethyltriethoxysilane, 2-mercaptoethyltripropoxysilane, 3-mercaptopropyltrimethoxysilane, 3-mercaptopropyltriethoxysilane, and 3-mercaptopropyltripropoxysilane.

Examples of the silane coupling agent represented by the formula (c-2) include an alkanoylthioalkyltrialkoxysilane compound such as 2-hexanoylthioethyltrimethoxysilane, 2-hexanoylthioethyltriethoxysilane, 2-octanoylthioethyltrimethoxysilane, 2-octanoylthioethyltriethoxysilane, 2-decanoylthioethyltrimethoxysilane, 2-decanoylthioethyltriethoxysilane, 3-hexanoylthiopropyltrimethoxysilane, 3-hexanoylthiopropyltriethoxysilane, 3-octanoylthiopropyltrimethoxysilane, 3-octanoylthiopropyltriethoxysilane, 3-decanoylthiopropyltrimethoxysilane, and 3-decanoylthiopropyltriethoxysilane.

Examples of the silane coupling agent represented by the formula (c-3) include 2-trimethoxysilylethylsulfanyltrimethoxysilane, 2-trimethoxysilylethylsulfanyltriethoxysilane, 2-triethoxysilylethylsulfanyltrimethoxysilane, 2-triethoxysilylethylsulfanyltriethoxysilane, 3-trimethoxysilylpropylsulfanyltrimethoxysilane, 3-trimethoxysilylpropylsulfanyltriethoxysilane, 3-triethoxysilylpropylsulfanyltrimethoxysilane, 3-triethoxysilylpropylsulfanyltriethoxysilane, and the like.

Examples of the silane coupling agent represented by the formula (c-4) include a disulfide compound such as bis(2-trimethoxysilylethyl) disulfide, bis(2-triethoxysilylethyl) disulfide, bis(3-trimethoxysilylpropyl) disulfide, bis(3-triethoxysilylpropyl) disulfide, bis(4-trimethoxysilylbutyl) disulfide, and bis(4-triethoxysilylbutyl) disulfide; a tetrasulfide compound such as bis(2-triethoxysilylethyl) tetrasulfide, bis(3-trimethoxysilylpropyl) tetrasulfide, and bis(3-triethoxysilylpropyl) tetrasulfide; and the like.

Examples of other silane coupling agents that include a sulfur atom-containing functional group include a thiocarbamoyl group-containing silane coupling agent such as 3-trimethoxysilylpropyl-N,N-dimethylthiocarbamoyl tetrasulfide, 3-triethoxysilylpropyl-N,N-dimethylthiocarbamoyl tetrasulfide, 2-triethoxysilylethyl-N,N-dimethylthiocarbamoyl tetrasulfide, and 2-trimethoxysilylethyl-N,N-dimethylthiocarbamoyl tetrasulfide; a benzothiazolyl group-containing silane coupling agent such as 3-trimethoxysilylpropylbenzothiazolyl tetrasulfide and 3-triethoxysilylpropylbenzothiazolyl tetrasulfide; a (meth)acrylate group-containing silane coupling agent (note: the term "(meth)acrylate" refers to an acrylate or a methacrylate) such as 3-triethoxysilylpropyl (meth)acrylate monosulfide and 3-trimethoxysilylpropyl (meth)acrylate monosulfide; a polysulfide group-containing silane coupling agent such as a bis(3-triethoxysilylpropyl) polysulfid, a bis(2-triethoxysilylpropyl) polysulfide, and a bis(4-triethoxysilylbutyl) polysulfide; and the like.

Among these, the silane coupling agent represented by the formula (c-1), the silane coupling agent represented by the formula (c-3), and oligomers thereof are preferable, the silane coupling agent represented by the formula (c-1) in which Y$^1$ is an alkoxy group having 1 to 10 carbon atoms (e.g., 2-mercaptoethyltrimethoxysilane, 2-mercaptoethyltriethoxysilane, 2-mercaptoethyltripropoxysilane, 3-mercaptopropyltrimethoxysilane, 3-mercaptopropyltriethoxysilane, and 3-mercaptopropyltripropoxysilane), the silane coupling agent represented by the formula (c-3) in which Y$^1$ and Y$^2$ are an alkoxy group having 1 to 10 carbon atoms (e.g., 2-trimethoxysilylethylsulfanyltrimethoxysilane, 2-trimethoxysilylethylsulfanyltriethoxysilane, 2-triethoxysilylethylsulfanyltrimethoxysilane, 2-triethoxysilylethylsulfanyltriethoxysilane, 3-trimethoxysilylpropylsulfanyltrimethoxysilane, 3-trimethoxysilylpropylsulfanyltriethoxysilane, 3-triethoxysilylpropylsulfanyltrimethoxysilane, and 3-triethoxysilylpropylsulfanyltriethoxysilane), and oligomers thereof are more preferable, and 3-mercaptopropyltrimethoxysilane, 3-trimethoxysilylpropylsulfanyltriethoxysilane, and oligomers thereof are still more preferable as the component (C).

These silane coupling agents (C) may be used either alone or in combination.

The component (C) is used in such an amount that the curable composition includes the component (A) and the component (C) in a mass ratio (component (A):component (C)) of 100:0.1 to 100:50, preferably 100:0.3 to 100:30, and more preferably 100:0.4 to 100:25.

When the component (A) and the component (C) are used in a ratio within the above range, the curable composition according to one embodiment of the invention produces a cured product that exhibits better heat resistance and adhesion.

The curable composition according to one embodiment of the invention may include a silane coupling agent that includes a nitrogen atom in its molecule (hereinafter may be referred to as "silane coupling agent (D)") as a component (D).

When the curable composition includes the component (D), the curable composition exhibits better workability during the application step, and produces a cured product that exhibits better adhesion, delamination resistance, and heat resistance.

The silane coupling agent (D) is not particularly limited as long as the silane coupling agent (D) includes a nitrogen atom in its molecule. Examples of the silane coupling agent (D) include a trialkoxysilane compound represented by the following formula (d-1), a dialkoxyalkylsilane compound or a dialkoxyarylsilane compound represented by the following formula (d-2), and the like.

$$(R^a)_3SiR^c \quad \text{(d-1)}$$

$$(R^a)_2(R^b)SiR^c \quad \text{(d-2)}$$

$R^a$ in the formulas (d-1) and (d-2) is an alkoxy group having 1 to 6 carbon atoms, such as a methoxy group, an ethoxy group, an n-propoxy group, an isopropoxy group, an n-butoxy group, or a t-butoxy group. A plurality of $R^a$ are either identical to or different from each other.

$R^b$ is an alkyl group having 1 to 6 carbon atoms, such as a methyl group, an ethyl group, an n-propyl group, an isopropyl group, an n-butyl group, or a t-butyl group, or a substituted or unsubstituted aryl group such as a phenyl group, a 4-chlorophenyl group, or a 4-methylphenyl group.

$R^c$ is an organic group having 1 to 10 carbon atoms that includes a nitrogen atom. $R^c$ may be bonded to a group that includes a silicon atom.

Specific examples of the organic group having 1 to 10 carbon atoms that is represented by $R^c$ include an N-2-(aminoethyl)-3-aminopropyl group, a 3-aminopropyl group, an N-(1,3-dimethylbutylidene)aminopropyl group, a 3-ureidopropyl group, an N-phenylaminopropyl group, and the like.

Examples of the compound that is represented by the formula (d-1) or (d-2) in which $R^c$ is an organic group that is further bonded to a group that includes a silicon atom, include a compound in which $R^c$ is further bonded to a group that includes a silicon atom through an isocyanurate skeleton to form an isocyanurate-based silane coupling agent, and a compound in which $R^c$ is further bonded to a group that includes a silicon atom through a urea skeleton to form a urea-based silane coupling agent.

The silane coupling agent (D) is preferably an isocyanurate-based silane coupling agent or a urea-based silane coupling agent, and more preferably an isocyanurate-based silane coupling agent or a urea-based silane coupling agent that includes four or more alkoxy groups bonded to a silicon atom in the molecule, since a cured product that exhibits higher adhesion is easily obtained.

Note that the expression "includes four or more alkoxy groups bonded to a silicon atom" used herein means that the total number of alkoxy groups bonded to an identical silicon atom and alkoxy groups bonded to different silicon atoms is equal to or larger than 4.

Examples of the isocyanurate-based silane coupling agent that includes four or more alkoxy groups bonded to a silicon atom include a compound represented by the following formula (d-3). Examples of the urea-based silane coupling agent that includes four or more alkoxy groups bonded to a silicon atom include a compound represented by the following formula (d-4).

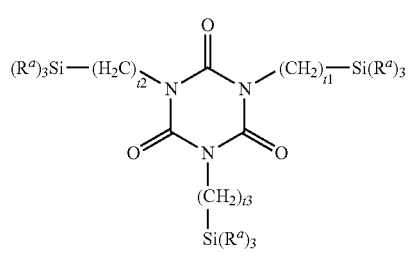

(d-3)

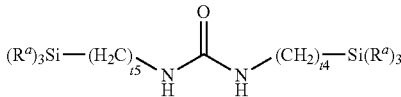

(d-4)

$R^a$ in the formulas (d-3) and (d-4) is the same as defined above.

t1 to t5 are independently an integer from 1 to 10, preferably an integer from 1 to 6, and particularly preferably 3.

Specific examples of the compound represented by the formula (d-3) include a 1,3,5-N-tris[(tri($C_{1-6}$)alkoxy)silyl($C_{1-10}$)alkyl] isocyanurate such as 1,3,5-N-tris(3-trimethoxysilylpropyl) isocyanurate, 1,3,5-N-tris(3-triethoxysilylpropyl) isocyanurate, 1,3,5-N-tris(3-tri-i-propoxysilylpropyl) isocyanurate, and 1,3,5-N-tris(3-tributoxysilylpropyl) isocyanurate; a 1,3,5-N-tris[(di($C_{1-6}$)alkoxy)silyl($C_{1-10}$)alkyl] isocyanurate such as 1,3,5-N-tris(3-dimethoxymethylsilylpropyl) isocyanurate, 1,3,5-N-tris(3-dimethoxyethylsilylpropyl) isocyanurate, 1,3,5-N-tris(3-dimethoxy-i-propylsilylpropyl) isocyanurate, 1,3,5-N-tris(3-dimethoxy-n-propylsilylpropyl) isocyanurate, 1,3,5-N-tris(3-dimethoxyphenylsilylpropyl) isocyanurate, 1,3,5-N-tris(3-diethoxymethylsilylpropyl) isocyanurate, 1,3,5-N-tris(3-diethoxyethylsilylpropyl) isocyanurate, 1,3,5-N-tris(3-diethoxy-i-propylsilylpropyl) isocyanurate, 1,3,5-N-tris(3-diethoxy-n-propylsilylpropyl) isocyanurate, 1,3,5-N-tris(3-diethoxyphenylsilylpropyl) isocyanurate, 1,3,5-N-tris(3-di-i-propoxymethylsilylpropyl) isocyanurate, 1,3,5-N-tris(3-di-i-propoxyethylsilylpropyl) isocyanurate, 1,3,5-N-tris(3-di-i-propoxy-i-propylsilylpropyl) isocyanurate, 1,3,5-N-tris(3-di-i-propoxy-n-propylsilylpropyl) isocyanurate, 1,3,5-N-tris(3-di-i-propoxyphenylsilylpropyl) isocyanurate, 1,3,5-N-tris(3-dibutoxymethylsilylpropyl) isocyanurate, 1,3,5-N-tris(3-dibutoxyethylsilylpropyl) isocyanurate, 1,3,5-N-tris(3-dibutoxy-i-propylsilylpropyl) isocyanurate, 1,3,5-N-tris(3-dibutoxy-n-propylsilylpropyl) isocyanurate, and 1,3,5-N-tris(3-dibutoxyphenylsilylpropyl) isocyanurate; and the like.

Specific examples of the compound represented by the formula (d-4) include an N,N'-bis[(tri($C_{1-6}$)alkoxysilyl)($C_{1-10}$)alkyl]urea such as N,N'-bis(3-trimethoxysilylpropyl)urea, N,N'-bis(3-triethoxysilylpropyl)urea, N,N'-bis(3-tripropoxysilylpropyl)urea, N,N'-bis(3-tributoxysilylpropyl)urea, and N,N'-bis(2-trimethoxysilylethyl)urea; an N,N'-bis[(di($C_{1-6}$)alkoxy($C_{1-6}$)alkylsilyl($C_{1-10}$)alkyl]urea such as N,N'-bis(3-dimethoxymethylsilylpropyl)urea, N,N'-bis(3-dimethoxyethylsilylpropyl)urea, and N,N'-bis(3-diethoxymethylsilylpropyl)urea; an N,N'-bis[(di($C_{1-6}$)alkoxy($C_{6-20}$)arylsilyl($C_{1-10}$)alkyl]urea such as N,N'-bis(3-dimethoxyphenylsilylpropyl)urea and N,N'-bis(3-diethoxyphenylsilylpropyl)urea; and the like.

It is preferable to use either or both of 1,3,5-N-tris(3-trimethoxysilylpropyl) isocyanurate and 1,3,5-N-tris(3-triethoxysilylpropyl) isocyanurate (hereinafter collectively referred to as "isocyanurate compound"), or either or both of N,N'-bis(3-trimethoxysilylpropyl)urea and N,N'-bis(3-triethoxysilylpropyl)urea (hereinafter collectively referred to as "urea compound"), or a combination of the isocyanurate compound and the urea compound, as the silane coupling agent (D).

When the isocyanurate compound and the urea compound are used in combination as the silane coupling agent (D), the isocyanurate compound and the urea compound are preferably used in a mass ratio (isocyanurate compound:urea compound) of 100:1 to 100:200, and more preferably 100:10 to 100:110. When the isocyanurate compound and the urea compound are used in a mass ratio within the above range, it is possible to obtain a curable composition that produces a cured product that exhibits better heat resistance and adhesion.

These silane coupling agents (D) may be used either alone or in combination.

When the curable composition according to one embodiment of the invention includes the component (D), the curable composition may include the component (D) in an arbitrary ratio. It is preferable that the curable composition include the component (A) and the component (D) in a mass ratio (component (A):component (D)) of 100:0.3 to 100:40, more preferably 100:1 to 100:30, and still more preferably 100:3 to 100:25.

When the curable composition includes the component (A) and the component (D) in a ratio within the above range, the curable composition produces a cured product that exhibits better heat resistance and adhesion.

The curable composition according to one embodiment of the invention may include a silane coupling agent that includes an acid anhydride structure in its molecule (hereinafter may be referred to as "silane coupling agent (E)") as a component (E).

The silane coupling agent (E) is an organosilicon compound that includes both a group (Q) having an acid anhydride structure and a hydrolyzable group ($R^b$) in one molecule. More specifically, the silane coupling agent (E) is a compound represented by the following formula (e-1).

When the curable composition includes the component (E), the curable composition exhibits better workability during the application step, and produces a cured product that exhibits better adhesion, delamination resistance, and heat resistance.

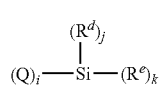

(e-1)

In the formula (e-1), Q is an acid anhydride structure, $R^d$ is an alkyl group having 1 to 6 carbon atoms, or a substituted or unsubstituted phenyl group, $R^e$ is an alkoxy group having 1 to 6 carbon atoms, or a halogen atom, i and k are an integer from 1 to 3, and j is an integer from 0 to 2, provided that i+j+k=4. A plurality of $R^d$ are either identical to or different from each other when j is 2. A plurality of $R^e$ are either identical to or different from each other when k is 2 or 3. A plurality of Q are either identical to or different from each other when i is 2 or 3.

Examples of Q include the groups respectively represented by the following formulas (Q1) to (Q4), and the like. The group represented by the formula (Q1) is particularly preferable.

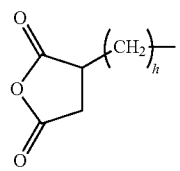

(Q1)

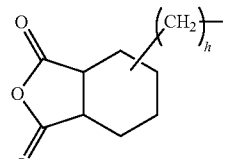

(Q2)

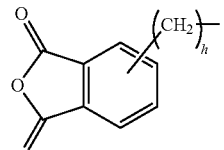

(Q3)

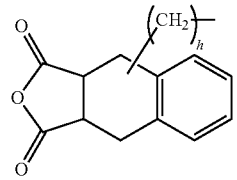

(Q4)

wherein h is an integer from 0 to 10.

Examples of the alkyl group having 1 to 6 carbon atoms that may be represented by $R^d$ in the formula (e-1) include those mentioned above in connection with the alkyl group having 1 to 6 carbon atoms that may be represented by $R^1$. Examples of the substituted or unsubstituted phenyl group that may be represented by $R^d$ in the formula (e-1) include those mentioned above in connection with the substituted or unsubstituted phenyl group that may be represented by R.

Examples of the alkoxy group having 1 to 6 carbon atoms that may be represented by $R^e$ include a methoxy group, an ethoxy group, a propoxy group, an isopropoxy group, a butoxy group, a t-butoxy group, and the like.

Examples of the halogen atom that may be represented by $R^e$ include a chlorine atom, a bromine atom, and the like.

A compound represented by the following formula (e-2) is preferable as the compound represented by the formula (e-1).

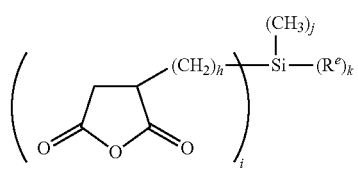

(e-2)

wherein $R^e$, h, i, j, and k are the same as defined above.

h in the formula (e-2) is preferably 2 to 8, more preferably 2 or 3, and particularly preferably 3.

Specific examples of the silane coupling agent represented by the formula (e-2) include a tri($C_{1-6}$)alkoxysilyl ($C_{2-8}$)alkylsuccinic anhydride such as 2-(trimethoxysilyl)ethylsuccinic anhydride, 2-(triethoxysilyl)ethylsuccinic anhydride, 3-(trimethoxysilyl)propylsuccinic anhydride, and 3-(triethoxysilyl)propylsuccinic anhydride; a di($C_{1-6}$)alkoxymethylsilyl($C_{2-8}$)alkylsuccinic anhydride such as 2-(dimethoxymethylsilyl)ethylsuccinic anhydride; a ($C_{1-6}$)alkoxydimethylsilyl($C_{2-8}$)alkylsuccinic anhydride such as 2-(methoxydimethylsilyl)ethylsuccinic anhydride;

a trihalogenosilyl($C_{2-8}$)alkylsuccinic anhydride such as 2-(trichlorosilyl)ethylsuccinic anhydride and 2-(tribromosilyl)ethylsuccinic anhydride; a dihalogenomethylsilyl($C_{2-8}$) alkylsuccinic anhydride such as 2-(dichloromethylsilyl)ethylsuccinic anhydride; a halogenodimethylsilyl($C_{2-8}$) alkylsuccinic anhydride such as 2-(chlorodimethylsilyl) ethylsuccinic anhydride; and the like.

These silane coupling agents (E) may be used either alone or in combination.

Among these, a tri($C_{1-6}$)alkoxysilyl($C_{2-8}$)alkylsuccinic anhydride is preferable, and 3-(trimethoxysilyl)propylsuccinic anhydride and 3-(triethoxysilyl)propylsuccinic anhydride are particularly preferable.

When the curable composition according to one embodiment of the invention includes the component (E), the curable composition may include the component (E) in an arbitrary ratio. It is preferable that the curable composition include the component (A) and the component (E) in a mass ratio (component (A):component (E)) of 100:0.01 to 100:30, and more preferably 100:0.1 to 100:10.

When the curable composition includes the component (A) and the component (E) in a ratio within the above range, the curable composition produces a cured product that exhibits better heat resistance and adhesion.

(F) Diluent

The curable composition according to one embodiment of the invention may include a diluent.

The diluent is used to provide fluidity to the curable composition according to one embodiment of the invention.

Examples of the diluent include diethylene glycol monobutyl ether acetate, glycerol diglycidyl ether, butanediol diglycidyl ether, diglycidylaniline, neopentyl glycol glycidyl ether, cyclohexanedimethanol diglycidyl ether, an alkylene diglycidyl ether, polyglycol diglycidyl ether, polypropylene glycol diglycidyl ether, trimethylolpropane triglycidyl ether, glycerol triglycidyl ether, 4-vinylcyclohexene monoxide, vinylcyclohexene dioxide, methylated vinylcyclohexene dioxide, and the like.

These diluents may be used either alone or in combination.

The diluent is preferably used so that the curable composition according to one embodiment of the invention has a solid content of 50 to 100 mass %, more preferably 60 to 90 mass %, and still more preferably 70 to 85 mass %.

When the curable composition according to one embodiment of the invention includes the diluent, it is preferable that the curable composition include the component (A), the component (B), and the component (C) in a total ratio of 50 to 100 mass %, and more preferably 60 to 100 mass %, based on the total amount of components included in the curable composition excluding the diluent. When the curable composition according to one embodiment of the invention includes the component (A), the component (B), and the component (C) in a total ratio within the above range, the curable composition according to one embodiment of the invention produces a cured product that exhibits better heat resistance and adhesion.

(G) Additional Component

The curable composition according to one embodiment of the invention may include an additional component other than the above components as long as the object of the invention is not impaired.

Examples of the additional component include an antioxidant, a UV absorber, a light stabilizer, and the like.

The antioxidant is added to the curable composition in order to prevent deterioration due to oxidation during heating. Examples of the antioxidant include a phosphorus-based antioxidant, a phenol-based antioxidant, a sulfur-based antioxidant, and the like.

Examples of the phosphorus-based antioxidant include a phosphite, an oxaphosphaphenanthrene oxide, and the like. Examples of the phenol-based antioxidant include a monophenol, a bisphenol, a polyphenol, and the like. Examples of the sulfur-based antioxidant include dilauryl 3,3'-thiodipropionate, dimyristyl 3,3'-thiodipropionate, and distearyl 3,3'-thiodipropionate, and the like.

These antioxidants may be used either alone or in combination. The antioxidant is normally used in a ratio of 10 mass % or less based on the component (A).

The UV absorber is added to the curable composition in order to improve the light resistance of the resulting cured product.

Examples of the UV absorber include salicylic acid and a derivative thereof, benzophenone and a derivative thereof, benzotriazole and a derivative thereof, a hindered amine, and the like.

These UV absorbers may be used either alone or in combination.

The UV absorber is normally used in a ratio of 10 mass % or less based on the component (A).

The light stabilizer is added to the curable composition in order to improve the light resistance of the resulting cured product.

Examples of the light stabilizer include a hindered amine such as poly[{6-(1,1,3,3-tetramethylbutyl)amino-1,3,5-triazine-2,4-diyl}{(2,2,6,6-tetramethyl-4-piperidine) imino}hexamethylene {(2,2,6,6-tetramethyl-4-piperidine) imino}], and the like.

These light stabilizers may be used either alone or in combination.

These additional components are normally used in a ratio of 20 mass % or less based on the component (A).

The curable composition according to one embodiment of the invention may be obtained by mixing the component (A), the component (B), the component (C), and an optional additional component in a given ratio, and defoaming the mixture, for example.

The mixing method and the defoaming method are not particularly limited. A known mixing method and a known defoaming method may be used.

As described above, the curable composition according to one embodiment of the invention includes the component (A), the component (B), and the component (C), and includes the component (A) and the component (B) in a mass ratio (component (A):component (B)) of 100:0.3 to 100:50.

The curable composition according to one embodiment of the invention thus exhibits excellent workability during the application step.

Specifically, when the curable composition according to one embodiment of the invention is discharged from a discharge tube, and the discharge tube is moved upward, the curable composition according to one embodiment of the invention strings to only a small extent, or breaks immediately. Therefore, when the curable composition according to one embodiment of the invention is used, it is possible to prevent a situation in which the coating target is contaminated due to resin paste bridge.

The curable composition according to one embodiment of the invention also has an advantage in that it is possible to prevent a situation in which a droplet formed by applying the curable composition spreads to contaminate the coating target.

It is preferable that the curable composition have a viscosity of 2 to 10 Pa·s, and more preferably 4 to 8 Pa·s, when measured at 25° C. and 200 s$^{-1}$ using an E-type viscometer, so that the curable composition exhibits better workability during the application step.

It is possible to obtain a cured product that exhibits excellent adhesion, excellent delamination resistance, and excellent heat resistance by utilizing the curable composition according to one embodiment of the invention.

Therefore, the curable composition according to one embodiment of the invention is suitably used as a raw material, an adhesive, a coating material, and the like for producing optical parts and formed articles. In particular, since the curable composition according to one embodiment of the invention can solve a problem with regard to deterioration in an optical element-securing material due to an increase in the brightness of an optical element, the curable composition can suitably be used as an optical element-securing composition.

2) Cured Product

A cured product according to one embodiment of the invention is obtained by curing the curable composition according to one embodiment of the invention.

The curable composition according to one embodiment of the invention may be cured by heating, for example. The heating temperature when curing the curable composition is normally 100 to 200° C., and the heating time is normally 10 minutes to 20 hours, and preferably 30 minutes to 10 hours.

The cured product according to one embodiment of the invention exhibits excellent adhesion, excellent delamination resistance, and excellent heat resistance.

Therefore, the cured product according to one embodiment of the invention may suitably be used as an optical element-securing material that can solve a problem with regard to deterioration due to an increase in the brightness of an optical element.

The cured product according to one embodiment of the invention exhibits excellent delamination resistance when the cured product is subjected to the following test, for example. Specifically, the curable composition is applied to an LED lead frame, and a sapphire chip is compression-bonded thereto. After curing the curable composition by heating at 170° C. for 2 hours, a sealing material is poured into the cup, and heated at 150° C. for 1 hour to obtain a cured product specimen. The specimen is allowed to stand at a temperature of 85° C. and a relative humidity of 85% RH for 168 hours, subjected to an IR reflow process (preheating temperature: 160° C., maximum temperature: 260° C., heating time: 1 minute), and subjected to a thermal cycle test (300 cycles, wherein one cycle consists of allowing the specimen to stand at −40° C. for 30 minutes, and allowing the specimen to stand at +100° C. for 30 minutes) using a thermal cycle tester. The sealing material is then removed to determine whether or not the element is removed (delaminated) together with the sealing material. The delamination probability is normally 45% or less, and preferably 25% or less, when the cured product according to one embodiment of the invention is used.

The cured product according to one embodiment of the invention exhibits excellent adhesion and excellent heat resistance when the cured product is subjected to the following test, for example. Specifically, the curable composition according to one embodiment of the invention is applied to a mirror surface of a silicon chip. The surface of the silicon chip to which the curable composition has been applied is placed on and compression-bonded to an adherend, and the curable composition is cured by heating. After allowing the resulting product to stand for 30 seconds on the measurement stage of a bond tester that has been heated to a specific temperature (e.g., 23 or 100° C.), the adhesion between the specimen and the adherend is measured while applying a stress to the bonding surface in the horizontal direction (shear direction) at a height of 50 μm above the adherend.

It is preferable that the cured product have an adhesion at 23° C. of 60 N/2 mm☐ or more, more preferably 80 N/2 mm☐ or more, and particularly preferably 100 N/2 mm☐ or more. It is preferable that the cured product have an adhesion at 100° C. of 40 N/2 mm☐ or more, more preferably 50 N/2 mm☐ or more, and particularly preferably 60 N/2 mm☐ or more.

3) Method for Using Curable Composition

A method for using a curable composition according to one embodiment of the invention uses the curable composition according to one embodiment of the invention as an optical element-securing adhesive or an optical element sealing material.

Examples of the optical element include a light-emitting element (e.g., LED and LD), a light-receiving element, a hybrid optical element, an optical integrated circuit, and the like.

Optical Element-Securing Adhesive

The curable composition according to one embodiment of the invention may suitably be used as an optical element-securing adhesive.

When the curable composition according to one embodiment of the invention is used as an optical element-securing adhesive, the curable composition is applied to the bonding surface of either or both of the bonding target materials (e.g., an optical element and a substrate). After compression-bonding the bonding target materials, the curable composition is cured by heating to firmly bond the bonding target materials, for example.

Examples of a substrate material to which the optical element is bonded, include glass such as soda lime glass and heat-resistant hard glass; a ceramic; sapphire; a metal such as iron, copper, aluminum, gold, silver, platinum, chromium, titanium, alloys thereof, and stainless steel (e.g., SUS302, SUS304, SUS304L, and SUS309); a synthetic resin such as polyethylene terephthalate, polybuthylene terephthalate, polyethylene naphthalate, an ethylene-vinyl acetate copolymer, polystyrene, a polycarbonate, polymethylpentene, a polysulfone, polyether ether ketone, polyethersulfone, polyphenylene sulfide, polyetherimide, a polyimide, a polyamide, an acrylic resin, a norbornene-based resin, a cycloolefin resin, and a glass epoxy resin; and the like.

The heating temperature when curing the curable composition is selected taking account of the type of curable composition and the like, but is normally 100 to 200° C. The heating time is normally 10 minutes to 20 hours, and preferably 30 minutes to 10 hours.

Optical Element Sealing Material

The curable composition according to one embodiment of the invention may suitably be used as an optical element sealing material.

When the curable composition according to one embodiment of the invention is used as an optical element sealing material, the curable composition is formed to have the desired shape to obtain a formed article in which an optical element is enclosed. The formed article is then cured by heating to produce a sealed optical element, for example.

The curable composition according to one embodiment of the invention may be formed to have the desired shape using an arbitrary method. A known molding method such as a transfer molding method and a casting method may be used.

The heating temperature employed when curing the formed article (curable composition) is selected taking account of the type of curable composition and the like, but is normally 100 to 200° C. The heating time is normally 10 minutes to 20 hours, and preferably 30 minutes to 10 hours.

Since the sealed optical element is produced using the curable composition according to one embodiment of the invention, the sealed optical element exhibits excellent delamination resistance, excellent heat resistance, and high adhesion.

4) Optical Device

An optical device according to one embodiment of the invention is produced using the curable composition according to one embodiment of the invention as an optical element-securing adhesive or an optical element sealing material.

Examples of the optical element include a light-emitting element (e.g., LED and LD), a light-receiving element, a hybrid optical element, an optical integrated circuit, and the like.

The optical device according to one embodiment of the invention is produced by securing an optical element using the curable composition according to one embodiment of the invention as an optical element-securing adhesive or an optical element sealing material. Therefore, the optical device according to one embodiment of the invention has a structure in which the optical element is secured with high adhesion, and exhibits excellent durability.

EXAMPLES

The invention is further described below by way of examples and comparative examples. Note that the invention is not limited to the following examples. The units "%" and "parts" used in connection with the examples and the comparative examples respectively refer to "mass %" and "parts by mass" unless otherwise indicated.

Measurement of Average Molecular Weight

The standard polystyrene-equivalent mass average molecular weight (Mw) and the standard polystyrene-equivalent number average molecular weight (Mn) of the silane compound polymer obtained in Production Example 1 were determined using the device listed below under the conditions listed below.

Device: HLC-8220 GPC manufactured by Tosoh Corporation
Column: TSKgel GMHXL, TSKgel GMHXL, and TSKgel 2000HXL were connected in series
Eluent: tetrahydrofuran
Injection amount: 80 μl
Measurement temperature: 40° C.
Flow rate: 1 ml/min
Detector: differential refractometer Measurement of IR Spectrum The IR spectrum of the silane compound polymer obtained in Production Example 1 was measured using a Fourier transform infrared spectrometer ("Spectrum 100" manufactured by PerkinElmer).

Production Example 1

A 300 ml recovery flask was charged with 71.37 g (400 mmol) of methyltriethoxysilane ("KBE-13" manufactured by Shin-Etsu Chemical Co., Ltd.). After the addition of an aqueous solution prepared by dissolving 0.10 g (0.25 mol % based on the total amount of silane compound) of 35% hydrochloric acid in 21.6 ml of distilled water with stirring, the mixture was stirred at 30° C. for 2 hours, and stirred at 70° C. for 5 hours, followed by the addition of 140 g of propyl acetate. After the addition of 0.12 g (0.5 mol % based on the total amount of silane compound) of 28% aqueous ammonia to the mixture with stirring, the resulting mixture was heated to 70° C., and stirred for 3 hours. Purified water was added to the reaction mixture to effect separation. This operation was repeated until the aqueous layer had a pH of 7. The organic layer was concentrated using an evaporator, and the concentrate was dried under vacuum to obtain 55.7 g of a silane compound polymer (A1). The silane compound polymer (A1) had a mass average molecular weight (Mw) of 7,800 and a molecular weight distribution (Mw/Mn) of 4.52.

The IR spectral data of the silane compound polymer (A1) is shown below. Si—$CH_3$: 1272 $cm^{-1}$, 1409 $cm^{-1}$, Si—O: 1132 $cm^{-1}$ The compounds and the like used in connection with the examples and the comparative examples were as follows.

Component (A)

Silane compound polymer (A1): curable polysilsesquioxane compound obtained in Production Example 1

Component (B)

Fine particles (B1): silica fine particles ("AEROSIL 200" manufactured by Nippon Aerosil Co., Ltd., average primary particle size: 12 nm, specific surface area: 200 $m^2/g$)

Fine particles (B2): silica fine particles ("AEROSIL 300" manufactured by Nippon Aerosil Co., Ltd., average primary particle size: 7 nm, specific surface area: 300 $m^2/g$)

Fine particles (B3): silica fine particles ("AEROSIL NX90" manufactured by Nippon Aerosil Co., Ltd., average primary particle size: 20 nm, specific surface area: 65 $m^2/g$)

Fine particles (B4): silica fine particles ("AEROSIL RX200" manufactured by Nippon Aerosil Co., Ltd., average primary particle size: 12 nm, specific surface area: 140 $m^2/g$)

Fine particles (B5): silica fine particles ("AEROSIL RX300" manufactured by Nippon Aerosil Co., Ltd., average primary particle size: 7 nm, specific surface area: 210 $m^2/g$)

Fine particles (B6): silica fine particles ("AEROSIL RY300" manufactured by Nippon Aerosil Co., Ltd., average primary particle size: 7 nm, specific surface area: 125 $m^2/g$)

Fine particles (B7): silica fine particles ("AEROSIL R974" manufactured by Nippon Aerosil Co., Ltd., average primary particle size: 12 nm, specific surface area: 170 $m^2/g$)

Fine particles (B8): silica fine particles ("AEROSIL R805" manufactured by Nippon Aerosil Co., Ltd., average primary particle size: 12 nm, specific surface area: 150 $m^2/g$)

Fine particles (B9): silica fine particles ("SILFIL NSS-5N" manufactured by Tokuyama Corporation, average primary particle size: 70 nm)

Component (C)

Silane coupling agent (C1): 3-mercaptopropyltrimethoxysilane ("KBM-803" manufactured by Shin-Etsu Chemical Co., Ltd.)

Silane coupling agent (C2): 3-trimethoxysilylpropylsulfanyltriethoxysilane ("X-12-1056ES" manufactured by Shin-Etsu Chemical Co., Ltd.)

Silane coupling agent (C3): methoxy group-containing oligomer (mercapto equivalent: 450 g/mol) ("X-41-1810" manufactured by Shin-Etsu Chemical Co., Ltd.)

Component (D)

Silane coupling agent (D1): 1,3,5-N-tris[3-(trimethoxysilyl)propyl]isocyanurate ("KBM-9659" manufactured by Shin-Etsu Chemical Co., Ltd.)

Component (E)
Silane coupling agent (E1): 3-(trimethoxysilyl)propylsuccinic anhydride ("X-12-967C" manufactured by Shin-Etsu Chemical Co., Ltd.)

Example 1

The fine particles (B1) (15 parts) and the silane coupling agent (C1) (1 part) were added to the silane compound polymer (A1) (100 parts). After the addition of diethylene glycol monobutyl ether acetate so that the viscosity measured at 25° C. and 200 s$^{-1}$ using an E-type viscometer was 6.2 Pa·s, the mixture was sufficiently mixed and defoamed to obtain a curable composition.

Examples 2 to 117, Comparative Examples 1 to 8, and Reference Examples 1 to 3

A curable composition was obtained in the same manner as in Example 1, except that the composition and the viscosity were changed as listed in Tables 1 to 4.

TABLE 1

| | Silane compound polymer (A1) Amount (parts) | Fine particles Type | Fine particles Average primary particle size (nm) | Fine particles Amount (parts) | Silane coupling agent (parts) (C1) | (C2) | (C3) | (D1) | (D2) | Curable resin composition Viscosity (200 s$^{-1}$) |
|---|---|---|---|---|---|---|---|---|---|---|
| Example 1 | 100 | (B1) | 12 | 15 | 1 | — | — | — | — | 6.2 |
| Example 2 | 100 | | | 15 | — | 1 | — | — | — | 5.9 |
| Example 3 | 100 | | | 15 | — | — | 1 | — | — | 4.7 |
| Example 4 | 100 | (B2) | 7 | 15 | 1 | — | — | — | — | 6.1 |
| Example 5 | 100 | | | 15 | — | 1 | — | — | — | 8.2 |
| Example 6 | 100 | | | 15 | — | — | 1 | — | — | 7.6 |
| Example 7 | 100 | (B3) | 20 | 15 | 1 | — | — | — | — | 6.5 |
| Example 8 | 100 | | | 15 | — | 1 | — | — | — | 4.1 |
| Example 9 | 100 | | | 15 | — | — | 1 | — | — | 8.4 |
| Example 10 | 100 | (B4) | 12 | 15 | 1 | — | — | — | — | 6.6 |
| Example 11 | 100 | | | 15 | — | 1 | — | — | — | 3.9 |
| Example 12 | 100 | | | 15 | — | — | 1 | — | — | 4.3 |
| Example 13 | 100 | (B5) | 7 | 5 | 1 | — | — | — | — | 8.1 |
| Example 14 | 100 | | | 5 | — | 1 | — | — | — | 7.4 |
| Example 15 | 100 | | | 5 | — | — | 1 | — | — | 7.6 |
| Example 16 | 100 | | | 10 | 1 | — | — | — | — | 6.8 |
| Example 17 | 100 | | | 10 | — | 1 | — | — | — | 7.7 |
| Example 18 | 100 | | | 10 | — | — | 1 | — | — | 3.9 |
| Example 19 | 100 | | | 15 | 1 | — | — | — | — | 5.4 |
| Example 20 | 100 | | | 15 | 3 | — | — | — | — | 6 |
| Example 21 | 100 | | | 15 | 5 | — | — | — | — | 4.9 |
| Example 22 | 100 | | | 15 | — | 1 | — | — | — | 6.2 |
| Example 23 | 100 | | | 15 | — | 3 | — | — | — | 6.8 |
| Example 24 | 100 | | | 15 | — | 5 | — | — | — | 7.3 |
| Example 25 | 100 | | | 15 | — | — | 1 | — | — | 8.1 |
| Example 26 | 100 | | | 15 | — | — | 3 | — | — | 5.6 |
| Example 27 | 100 | | | 15 | — | — | 5 | — | — | 3.3 |
| Example 28 | 100 | | | 15 | 60 | — | — | — | — | 6 |
| Example 29 | 100 | | | 15 | — | 60 | — | — | — | 8.6 |
| Example 30 | 100 | | | 15 | — | — | 60 | — | — | 7.2 |
| Example 31 | 100 | | | 20 | 1 | — | — | — | — | 6.4 |
| Example 32 | 100 | | | 20 | 3 | — | — | — | — | 8.2 |
| Example 33 | 100 | | | 20 | 5 | — | — | — | — | 7.7 |
| Example 34 | 100 | | | 20 | — | 1 | — | — | — | 6.3 |
| Example 35 | 100 | | | 20 | — | 3 | — | — | — | 8.4 |
| Example 36 | 100 | | | 20 | — | 5 | — | — | — | 5.5 |
| Example 37 | 100 | | | 20 | — | — | 1 | — | — | 3.9 |
| Example 38 | 100 | | | 20 | — | — | 3 | — | — | 7.1 |
| Example 39 | 100 | | | 20 | — | — | 5 | — | — | 6 |
| Example 40 | 100 | | | 25 | 1 | — | — | — | — | 5.9 |
| Example 41 | 100 | | | 25 | — | 1 | — | — | — | 8.2 |
| Example 42 | 100 | | | 25 | — | — | 1 | — | — | 7.4 |

TABLE 2

| | Silane compound polymer (A1) Amount (parts) | Fine particles Type | Fine particles Average primary particle size (nm) | Fine particles Amount (parts) | Silane coupling agent (parts) (C1) | (D1) | (E1) | (E2) | (E3) | Curable resin composition Viscosity (200 s$^{-1}$) |
|---|---|---|---|---|---|---|---|---|---|---|
| Example 43 | 100 | (B6) | 7 | 15 | 1 | — | — | — | — | 8.5 |
| Example 44 | 100 | | | 15 | — | 1 | — | — | — | 7.7 |
| Example 45 | 100 | | | 15 | — | — | 1 | — | — | 6.1 |
| Example 46 | 100 | (B7) | 12 | 15 | 1 | — | — | — | — | 3.9 |
| Example 47 | 100 | | | 15 | — | 1 | — | — | — | 4.1 |
| Example 48 | 100 | | | 15 | — | — | 1 | — | — | 5.8 |
| Example 49 | 100 | (B8) | 12 | 15 | 1 | — | — | — | — | 6.4 |

TABLE 2-continued

|  | Silane compound polymer (A1) Amount (parts) | Fine particles Type | Fine particles Average primary particle size (nm) | Fine particles Amount (parts) | Silane coupling agent (parts) (C1) | Silane coupling agent (parts) (D1) | Silane coupling agent (parts) (E1) | Silane coupling agent (parts) (E2) | Silane coupling agent (parts) (E3) | Curable resin composition Viscosity (200 s$^{-1}$) |
|---|---|---|---|---|---|---|---|---|---|---|
| Example 50 | 100 | | | 15 | — | 1 | — | — | — | 7.1 |
| Example 51 | 100 | | | 15 | — | — | 1 | — | — | 7.4 |
| Example 52 | 100 | (B5) | 7 | 15 | 1 | — | — | 1 | — | 6.2 |
| Example 53 | 100 | | | 15 | 1 | — | — | 5 | — | 5.9 |
| Example 54 | 100 | | | 15 | 1 | — | — | 10 | — | 4.8 |
| Example 55 | 100 | | | 15 | — | 1 | — | 1 | — | 3.8 |
| Example 56 | 100 | | | 15 | — | 1 | — | 5 | — | 4.1 |
| Example 57 | 100 | | | 15 | — | 1 | — | 10 | — | 5.9 |
| Example 58 | 100 | | | 15 | — | — | 1 | 1 | — | 8.7 |
| Example 59 | 100 | | | 15 | — | — | 1 | 5 | — | 8.2 |
| Example 60 | 100 | | | 15 | — | — | 1 | 10 | — | 6.1 |
| Example 61 | 100 | | | 15 | 1 | — | — | — | 1 | 5.9 |
| Example 62 | 100 | | | 15 | 1 | — | — | — | 3 | 4.4 |
| Example 63 | 100 | | | 15 | 1 | — | — | — | 5 | 3.9 |
| Example 64 | 100 | | | 15 | — | 1 | — | — | 1 | 5.4 |
| Example 65 | 100 | | | 15 | — | 1 | — | — | 3 | 6.2 |
| Example 66 | 100 | | | 15 | — | 1 | — | — | 5 | 4.9 |
| Example 67 | 100 | | | 15 | — | — | 1 | — | 1 | 3.1 |
| Example 68 | 100 | | | 15 | — | — | 1 | — | 3 | 6.8 |
| Example 69 | 100 | | | 15 | — | — | 1 | — | 5 | 6.6 |

TABLE 3

|  | Silane compound polymer (A1) Amount (parts) | Fine particles Type | Fine particles Average primary particle size (nm) | Fine particles Amount (parts) | Silane coupling agent (parts) (C1) | Silane coupling agent (parts) (D1) | Silane coupling agent (parts) (E1) | Silane coupling agent (parts) (E2) | Silane coupling agent (parts) (E3) | Curable resin composition Viscosity (200 s$^{-1}$) |
|---|---|---|---|---|---|---|---|---|---|---|
| Example 70 | 100 | (B1) | 12 | 15 | 1 | — | — | 10 | 3 | 4.5 |
| Example 71 | 100 | | | 15 | — | 1 | — | 10 | 3 | 4.6 |
| Example 72 | 100 | | | 15 | — | — | 1 | 10 | 3 | 5.0 |
| Example 73 | 100 | (B2) | 7 | 15 | 1 | — | — | 10 | 3 | 4.7 |
| Example 74 | 100 | | | 15 | — | 1 | — | 10 | 3 | 4.3 |
| Example 75 | 100 | | | 15 | — | — | 1 | 10 | 3 | 4.4 |
| Example 76 | 100 | (B3) | 20 | 15 | 1 | — | — | 10 | 3 | 3.9 |
| Example 77 | 100 | | | 15 | — | 1 | — | 10 | 3 | 3.7 |
| Example 78 | 100 | | | 15 | — | — | 1 | 10 | 3 | 4.2 |
| Example 79 | 100 | (B4) | 12 | 15 | 1 | — | — | 10 | 3 | 5.4 |
| Example 80 | 100 | | | 15 | — | 1 | — | 10 | 3 | 6.1 |
| Example 81 | 100 | | | 15 | — | — | 1 | 10 | 3 | 4.2 |
| Example 82 | 100 | (B5) | 7 | 5 | 1 | — | — | 10 | 3 | 6.4 |
| Example 83 | 100 | | | 5 | — | 1 | — | 10 | 3 | 5.3 |
| Example 84 | 100 | | | 5 | — | — | 1 | 10 | 3 | 7.6 |
| Example 85 | 100 | | | 10 | 1 | — | — | 10 | 3 | 8.2 |
| Example 86 | 100 | | | 10 | — | 1 | — | 10 | 3 | 6.4 |
| Example 87 | 100 | | | 10 | — | — | 1 | 10 | 3 | 6.1 |
| Example 88 | 100 | | | 15 | 1 | — | — | 10 | 3 | 5.9 |
| Example 89 | 100 | | | 15 | 3 | — | — | 10 | 3 | 5.1 |
| Example 90 | 100 | | | 15 | 5 | — | — | 10 | 3 | 4.7 |
| Example 91 | 100 | | | 15 | — | 1 | — | 10 | 3 | 6.5 |
| Example 92 | 100 | | | 15 | — | 3 | — | 10 | 3 | 6.2 |
| Example 93 | 100 | | | 15 | — | 5 | — | 10 | 3 | 6.7 |
| Example 94 | 100 | | | 15 | — | — | 1 | 10 | 3 | 5.8 |
| Example 95 | 100 | | | 15 | — | — | 3 | 10 | 3 | 4.3 |
| Example 96 | 100 | | | 15 | — | — | 5 | 10 | 3 | 3.9 |
| Example 97 | 100 | | | 20 | 1 | — | — | 10 | 3 | 6.9 |
| Example 98 | 100 | | | 20 | 3 | — | — | 10 | 3 | 8.4 |
| Example 99 | 100 | | | 20 | 5 | — | — | 10 | 3 | 7.2 |
| Example 100 | 100 | | | 20 | — | 1 | — | 10 | 3 | 6.4 |
| Example 101 | 100 | | | 20 | — | 3 | — | 10 | 3 | 7.9 |
| Example 102 | 100 | | | 20 | — | 5 | — | 10 | 3 | 5.1 |
| Example 103 | 100 | | | 20 | — | — | 1 | 10 | 3 | 3.0 |
| Example 104 | 100 | | | 20 | — | — | 3 | 10 | 3 | 5.8 |
| Example 105 | 100 | | | 20 | — | — | 5 | 10 | 3 | 6.3 |
| Example 106 | 100 | | | 25 | 1 | — | — | 10 | 3 | 5.4 |
| Example 107 | 100 | | | 25 | — | 1 | — | 10 | 3 | 8.6 |
| Example 108 | 100 | | | 25 | — | — | 1 | 10 | 3 | 7.5 |

TABLE 4

| | Silane compound polymer (A1) | Fine particles | | | Silane coupling agent (parts) | | | | | Curable resin composition |
|---|---|---|---|---|---|---|---|---|---|---|
| | Amount (parts) | Type | Average primary particle size (nm) | Amount (parts) | (C1) | (D1) | (E1) | (E2) | (E3) | Viscosity (200 s$^{-1}$) |
| Example 109 | 100 | (B6) | 7 | 15 | 1 | — | — | 10 | 3 | 3.9 |
| Example 110 | 100 | | | 15 | — | 1 | — | 10 | 3 | 4.6 |
| Example 111 | 100 | | | 15 | — | — | 1 | 10 | 3 | 7.4 |
| Example 112 | 100 | (B7) | 12 | 15 | 1 | — | — | 10 | 3 | 4.7 |
| Example 113 | 100 | | | 15 | — | 1 | — | 10 | 3 | 6.5 |
| Example 114 | 100 | | | 15 | — | — | 1 | 10 | 3 | 8.2 |
| Example 115 | 100 | (B8) | 12 | 15 | 1 | — | — | 10 | 3 | 7.1 |
| Example 116 | 100 | | | 15 | — | 1 | — | 10 | 3 | 6.4 |
| Example 117 | 100 | | | 15 | — | — | 1 | 10 | 3 | 8.8 |
| Comparative Example 1 | 100 | — | — | — | — | — | — | — | — | 6.7 |
| Comparative Example 2 | 100 | (B5) | 7 | 0.1 | — | — | — | — | — | 7.2 |
| Comparative Example 3 | 100 | | | 5 | — | — | — | — | — | 8.4 |
| Comparative Example 4 | 100 | | | 10 | — | — | — | — | — | 6.7 |
| Comparative Example 5 | 100 | | | 15 | — | — | — | — | — | 5.7 |
| Comparative Example 6 | 100 | | | 20 | — | — | — | — | — | 6.9 |
| Comparative Example 7 | 100 | | | 60 | — | — | — | — | — | 4.8 |
| Comparative Example 8 | 100 | (B9) | 70 | 15 | 3 | — | — | — | — | 6.5 |
| Reference Example 1 | 100 | — | — | — | — | — | — | 10 | 3 | 5.2 |
| Reference Example 2 | 100 | — | — | — | — | — | — | 10 | 3 | 7.1 |
| Reference Example 3 | 100 | — | — | — | — | — | — | 10 | 3 | 30.4 |

The tests described below were performed using the curable compositions obtained in the examples, comparative examples, reference examples. The results are listed in Tables 5 to 8.

Adhesion

The curable composition was applied to a mirror surface of a silicon chip (2×2 mm) to a thickness of about 2 μm. The surface of the silicon chip to which the curable composition was applied was placed on and compression-bonded to an adherend (silver-plated copper sheet). The curable composition was cured by heating at 170° C. for 2 hours to prepare a specimen-bonded adherend. After allowing the specimen-bonded adherend to stand for 30 seconds on the measurement stage of a bond tester ("Series 4000" manufactured by Dage Co., Ltd.) that had been heated to a given temperature (23° C. or 100° C.), adhesion (N/2 mm□) (23° C. and 100° C.) between the specimen and the adherend was measured while applying stress (speed: 200 μm/s) to the bonding surface in the horizontal direction (shearing direction) at a height of 50 μm above the adherend.

Delamination Resistance Test

The curable composition was applied to an LED lead frame ("5050 D/G PKG LEAD FRAME" manufactured by Enomoto Co., Ltd.) to a diameter of about 0.4 mm, and a sapphire chip (0.5×0.5 mm) was compression-bonded thereto. After curing the curable composition by heating at 170° C. for 2 hours, a sealing material ("EG6301" manufactured by Shin-Etsu Chemical Co., Ltd.) was poured into the cup, and heated at 150° C. for 1 hour to obtain a specimen.

The specimen was allowed to stand at a temperature of 85° C. and a relative humidity of 85% RH for 168 hours, and subjected to an IR reflow process (preheating temperature: 160° C., maximum temperature: 260° C., heating time: 1 minute) (reflow furnace: "WL-15-20DNX" manufactured by Sagami-Rikou Co. Ltd.). The specimen that had been subjected to the IR reflow process was subjected to a thermal cycle test (300 cycles, wherein one cycle consists of allowing the specimen to stand at −40° C. for 30 minutes, and allowing the specimen to stand at +100° C. for 30 minutes) using a thermal cycle tester. The sealing material was then removed to determine whether or not the element was removed (delaminated) together with the sealing material. Each curable composition was subjected to this test a plurality of times (e.g., 12 times in Example 1).

The number of times (NG count) that the element was removed (delaminated) together with the sealing material is listed in Tables 5 to 8. The delamination rate (NG rate=(NG count/total count)×100) was calculated. A case where the delamination rate was 25% or less was evaluated as "A", a case where the delamination rate was more than 25% and 50% or less was evaluated as "B", and a case where the delamination rate was more than 50% was evaluated as "C".

Workability Evaluation 1: Stringing Height

A syringe was filled with the curable composition, and the curable composition was defoamed, and applied (discharged) to have a diameter of about 1 mm using a dispenser ("SHOTMASTER 300" manufactured by Musashi Engineering, Inc.) and a needle having an outer diameter of 0.56 mm, an inner diameter of 0.31 mm, and a length of 8 mm (discharge pressure: 300 kPa, discharge time: 150 to 400 msec). The needle was then removed to measure the stringing height.

A curable composition having a high stringing height has a tendency that the coating target may be contaminated due to resin paste bridge, but a droplet formed by applying the curable composition spreads to only a small extent.

Workability Evaluation 2: Disappearance of Protrusion

A syringe was filled with the curable composition, and the curable composition was defoamed, and applied (discharged) to have a diameter of about 1 mm using a dispenser ("SHOTMASTER 300" manufactured by Musashi Engineering, Inc.) and a needle having an outer diameter of 0.56 mm, an inner diameter of 0.31 mm, and a length of 8 mm (discharge pressure: 300 kPa, discharge time: 150 to 400 msec).

The shape (change in shape) of a droplet formed by applying the curable composition was observed using a digital microscope ("Digital Microscope VHX-1000" manufactured by Keyence Corporation) immediately after application and after 30 minutes had elapsed from completion of application, and the disappearance of the protrusion situated at the center of the droplet was evaluated in accordance with the following standard.
A: The protrusion almost disappeared.
B: The protrusion disappeared to some extent.
C: The protrusion did not disappear.

A curable composition of which the protrusion does not easily disappear and which has a high stringing height has a tendency that resin paste bridge easily occurs.

Workability Evaluation 3: Resin Paste Bridge

A syringe was filled with the curable composition, and the curable composition was defoamed, and continuously applied (discharged) to have a diameter of about 1 mm using a dispenser ("SHOTMASTER 300" manufactured by Musashi Engineering, Inc.) and a needle having an outer diameter of 0.56 mm, an inner diameter of 0.31 mm, and a length of 8 mm (discharge pressure: 300 kPa, discharge time: 150 to 400 msec). The curable composition was evaluated with regard to resin paste bridge (i.e., a phenomenon in which the curable composition drips before the curable composition is applied at the next application point (i.e., contamination of the coating target)) in accordance with the following standard.
A: A string formed by the curable composition immediately broke, and contamination of the coating target did not occur.
B: A string formed by the curable composition broke while the needle was moved, and contamination of the coating target did not occur.
F: A string formed by the curable composition did not break, and the coating target was contaminated.

Workability Evaluation 4: Spreading Behavior

A syringe was filled with the curable composition, and the curable composition was defoamed, and applied (discharged) to have a diameter of about 0.4 mm using a dispenser ("SHOTMASTER 300" manufactured by Musashi Engineering, Inc.) and a needle having an outer diameter of 0.56 mm, an inner diameter of 0.31 mm, and a length of 8 mm (discharge pressure: 300 kPa, discharge time: 150 to 400 msec). The size of a droplet formed by applying the curable composition was observed (measured) using a digital microscope ("Digital Microscope VHX-1000" manufactured by Keyence Corporation) immediately after application and after 30 minutes had elapsed from completion of application, and the spreading behavior of the curable composition was evaluated in accordance with the following standard.
A: The size of the droplet changed to only a small extent.
F: The curable composition spread, and the size of the droplet increased.

TABLE 5

|  | Adhesion (N/2 mm□) | | Delamination resistance test | | | | Workability evaluation | | | |
|---|---|---|---|---|---|---|---|---|---|---|
|  | | | | | NG rate | | Stringing height | Disappearance | Resin paste | Spreading |
|  | 23° C. | 100° C. | NG count | Total count | (%) | Evaluation | (mm) | of protrusion | bridge | behavior |
| Example 1 | 126.4 | 65.2 | 5 | 12 | 42 | B | 5.0 | B | B | A |
| Example 2 | 129.2 | 68.4 | 5 | 12 | 42 | B | 5.0 | B | B | A |
| Example 3 | 124.7 | 68.3 | 4 | 12 | 33 | B | 5.0 | B | B | A |
| Example 4 | 136.9 | 61.9 | 6 | 12 | 50 | B | 5.0 | B | B | A |
| Example 5 | 132.6 | 68.5 | 5 | 12 | 42 | B | 5.0 | B | B | A |
| Example 6 | 129.5 | 63.1 | 5 | 12 | 42 | B | 5.0 | B | B | A |
| Example 7 | 121.3 | 76.6 | 3 | 12 | 25 | A | 3.8 | B | A | A |
| Example 8 | 126.1 | 78.2 | 3 | 12 | 25 | A | 3.4 | B | A | A |
| Example 9 | 132.2 | 69.4 | 3 | 12 | 25 | A | 3.6 | B | A | A |
| Example 10 | 129.4 | 69.1 | 3 | 12 | 25 | B | 3.2 | B | A | A |
| Example 11 | 135.2 | 73.3 | 2 | 12 | 17 | A | 3.3 | B | A | A |
| Example 12 | 137.6 | 67.0 | 2 | 12 | 17 | A | 3.5 | B | A | A |
| Example 13 | 143.5 | 87.6 | 3 | 12 | 25 | A | 5.0 | B | B | A |
| Example 14 | 148.7 | 85.1 | 2 | 12 | 17 | A | 5.0 | B | B | A |
| Example 15 | 153.9 | 79.9 | 2 | 12 | 17 | A | 5.0 | B | B | A |
| Example 16 | 138.7 | 86.4 | 2 | 12 | 17 | A | 4.5 | B | A | A |
| Example 17 | 142.6 | 89.2 | 1 | 12 | 8 | A | 4.3 | B | A | A |
| Example 18 | 149.1 | 84.1 | 2 | 12 | 17 | A | 4.7 | B | A | A |
| Example 19 | 132.6 | 81.3 | 2 | 12 | 17 | A | 3.8 | B | A | A |
| Example 20 | 138.4 | 85.4 | 3 | 12 | 25 | A | 3.4 | B | A | A |
| Example 21 | 142.8 | 92.7 | 0 | 12 | 0 | A | 3.9 | B | A | A |
| Example 22 | 127.1 | 86.1 | 3 | 12 | 25 | A | 2.9 | B | A | A |
| Example 23 | 134.9 | 94.4 | 1 | 12 | 8 | A | 3.4 | B | A | A |
| Example 24 | 144.5 | 99.8 | 2 | 12 | 17 | A | 3.5 | B | A | A |
| Example 25 | 129.60 | 87.70 | 2 | 12 | 17 | A | 2.8 | B | A | A |
| Example 26 | 133.8 | 93.5 | 3 | 12 | 25 | A | 3.1 | B | A | A |
| Example 27 | 142.7 | 96.6 | 3 | 12 | 25 | A | 3.0 | B | A | A |
| Example 28 | 132.7 | 58.1 | 5 | 12 | 42 | B | 2.7 | B | A | A |
| Example 29 | 141.5 | 60.4 | 4 | 12 | 33 | B | 2.4 | B | A | A |
| Example 30 | 138.0 | 62.3 | 6 | 12 | 50 | B | 2.9 | B | A | A |
| Example 31 | 124.6 | 76.1 | 3 | 12 | 25 | A | 2.3 | B | A | A |
| Example 32 | 128.4 | 80.3 | 3 | 12 | 25 | A | 2.4 | B | A | A |
| Example 33 | 136.2 | 84.6 | 1 | 12 | 8 | A | 1.9 | B | A | A |
| Example 34 | 132.8 | 79.2 | 3 | 12 | 25 | A | 2.0 | B | A | A |
| Example 35 | 135.5 | 83.4 | 1 | 12 | 8 | A | 1.7 | B | A | A |
| Example 36 | 141.7 | 88.0 | 0 | 12 | 0 | A | 2.4 | B | A | A |
| Example 37 | 136.1 | 75.5 | 2 | 12 | 17 | A | 2.6 | B | A | A |
| Example 38 | 135.9 | 79.6 | 0 | 12 | 0 | A | 2.1 | B | A | A |
| Example 39 | 142.3 | 83.9 | 0 | 12 | 0 | A | 2.3 | B | A | A |
| Example 40 | 122.8 | 70.3 | 3 | 12 | 25 | A | 1.6 | C | A | A |

TABLE 5-continued

| | Adhesion (N/2 mm□) | | Delamination resistance test | | | | Workability evaluation | | | |
|---|---|---|---|---|---|---|---|---|---|---|
| | | | | | | | Stringing height (mm) | Disappearance of protrusion | Resin paste bridge | Spreading behavior |
| | 23° C. | 100° C. | NG count | Total count | NG rate (%) | Evaluation | | | | |
| Example 41 | 118.4 | 76.2 | 3 | 12 | 25 | A | 1.3 | C | A | A |
| Example 42 | 119.3 | 75.9 | 2 | 12 | 17 | A | 1.4 | C | A | A |

TABLE 6

| | Adhesion (N/2 mm□) | | Delamination resistance test | | | | Workability evaluation | | | |
|---|---|---|---|---|---|---|---|---|---|---|
| | | | | | | | Stringing height (mm) | Disappearance of protrusion | Resin paste bridge | Spreading behavior |
| | 23° C. | 100° C. | NG count | Total count | NG rate (%) | Evaluation | | | | |
| Example 43 | 122.6 | 79.1 | 2 | 12 | 17 | A | 2.6 | B | A | A |
| Example 44 | 117.9 | 76.5 | 3 | 12 | 25 | A | 2.4 | B | A | A |
| Example 45 | 128.4 | 80.6 | 2 | 12 | 17 | A | 2.2 | B | A | A |
| Example 46 | 126.4 | 81.7 | 2 | 12 | 17 | A | 3.1 | B | A | A |
| Example 47 | 133.8 | 77.4 | 1 | 12 | 8 | A | 2.7 | B | A | A |
| Example 48 | 137.2 | 79.2 | 2 | 12 | 17 | A | 2.9 | B | A | A |
| Example 49 | 131.6 | 76.3 | 1 | 12 | 8 | A | 3.0 | B | A | A |
| Example 50 | 128.4 | 82.9 | 1 | 12 | 8 | A | 3.5 | B | A | A |
| Example 51 | 129.9 | 80.1 | 3 | 12 | 25 | A | 3.2 | B | A | A |
| Example 52 | 129.4 | 79.2 | 3 | 12 | 25 | A | 3.4 | B | A | A |
| Example 53 | 133.5 | 82.4 | 2 | 12 | 17 | A | 3.9 | B | A | A |
| Example 54 | 137.7 | 86.1 | 3 | 12 | 25 | A | 3.5 | B | A | A |
| Example 55 | 130.6 | 78.5 | 2 | 12 | 17 | A | 3.7 | B | A | A |
| Example 56 | 136.4 | 82.9 | 2 | 12 | 17 | A | 3.6 | B | A | A |
| Example 57 | 138.2 | 88.4 | 1 | 12 | 8 | A | 2.9 | B | A | A |
| Example 58 | 127.2 | 81.6 | 2 | 12 | 17 | A | 3 | B | A | A |
| Example 59 | 132.4 | 84.2 | 2 | 12 | 17 | A | 3.3 | B | A | A |
| Example 60 | 136.8 | 89.7 | 0 | 12 | 0 | A | 3.5 | B | A | A |
| Example 61 | 118.8 | 71.1 | 1 | 12 | 8 | A | 3.2 | B | A | A |
| Example 62 | 126.4 | 75.3 | 1 | 12 | 8 | A | 3.1 | B | A | A |
| Example 63 | 131.0 | 78.9 | 1 | 12 | 8 | A | 4.2 | B | A | A |
| Example 64 | 122.4 | 73.5 | 2 | 12 | 17 | A | 3.8 | B | A | A |
| Example 65 | 134.8 | 78.9 | 1 | 12 | 8 | A | 3.4 | B | A | A |
| Example 66 | 139.2 | 84.2 | 0 | 12 | 0 | A | 3 | B | A | A |
| Example 67 | 117.1 | 70.5 | 1 | 12 | 8 | A | 2.8 | B | A | A |
| Example 68 | 125.3 | 76.7 | 2 | 12 | 17 | A | 3.6 | B | A | A |
| Example 69 | 129.6 | 81.3 | 0 | 12 | 0 | A | 3.4 | B | A | A |

TABLE 7

| | Adhesion (N/2 mm□) | | Delamination resistance test | | | | Workability evaluation | | | |
|---|---|---|---|---|---|---|---|---|---|---|
| | | | | | | | Stringing height (mm) | Disappearance of protrusion | Resin paste bridge | Spreading behavior |
| | 23° C. | 100° C. | NG count | Total count | NG rate (%) | Evaluation | | | | |
| Example 70 | 150.4 | 86.2 | 5 | 12 | 42 | B | 5.0 | B | B | A |
| Example 71 | 155.7 | 89.1 | 4 | 12 | 33 | B | 5.0 | B | B | A |
| Example 72 | 152.8 | 87.8 | 4 | 12 | 33 | B | 4.8 | B | B | A |
| Example 73 | 139.6 | 90.3 | 5 | 12 | 42 | B | 4.8 | B | B | A |
| Example 74 | 143.2 | 89.1 | 5 | 12 | 42 | B | 4.9 | B | B | A |
| Example 75 | 140.4 | 89.4 | 4 | 12 | 33 | B | 5.0 | B | B | A |
| Example 76 | 167.3 | 86.2 | 3 | 12 | 25 | A | 4.6 | B | A | A |
| Example 77 | 165.9 | 84.3 | 2 | 12 | 17 | A | 4.2 | B | A | A |
| Example 78 | 162.5 | 85.7 | 3 | 12 | 25 | A | 4.5 | B | A | A |
| Example 79 | 157.4 | 90.5 | 4 | 12 | 33 | B | 3.2 | B | A | A |
| Example 80 | 163.5 | 89.4 | 3 | 12 | 25 | A | 2.7 | B | A | A |
| Example 81 | 159.3 | 91.3 | 3 | 12 | 25 | A | 2.9 | B | A | A |
| Example 82 | 179.1 | 110.5 | 2 | 12 | 17 | A | 5.0 | B | B | A |
| Example 83 | 180.6 | 108.6 | 1 | 12 | 8 | A | 4.9 | B | B | A |
| Example 84 | 183.3 | 108.5 | 2 | 12 | 17 | A | 5.0 | B | B | A |
| Example 85 | 167.5 | 116.3 | 3 | 12 | 25 | A | 5.0 | B | A | A |

TABLE 7-continued

|  | Adhesion (N/2 mm□) | | Delamination resistance test | | | | Workability evaluation | | | |
|---|---|---|---|---|---|---|---|---|---|---|
|  | | | | | NG rate | | Stringing height | Disappearance | Resin paste | Spreading |
|  | 23° C. | 100° C. | NG count | Total count | (%) | Evaluation | (mm) | of protrusion | bridge | behavior |
| Example 86 | 173.2 | 113.7 | 2 | 12 | 17 | A | 5.0 | B | A | A |
| Example 87 | 168.6 | 119.6 | 3 | 12 | 25 | A | 4.7 | B | A | A |
| Example 88 | 178.5 | 116.9 | 3 | 12 | 25 | A | 3.4 | B | A | A |
| Example 89 | 169.5 | 119.2 | 2 | 12 | 17 | A | 3.1 | B | A | A |
| Example 90 | 172.6 | 117.0 | 2 | 12 | 17 | A | 3.5 | B | A | A |
| Example 91 | 180.3 | 120.4 | 3 | 12 | 25 | A | 2.7 | B | A | A |
| Example 92 | 182.3 | 118.7 | 1 | 12 | 8 | A | 2.9 | B | A | A |
| Example 93 | 184.0 | 119.8 | 2 | 12 | 17 | A | 3.1 | B | A | A |
| Example 94 | 174.1 | 120.7 | 2 | 12 | 17 | A | 2.6 | B | A | A |
| Example 95 | 173.6 | 121.4 | 2 | 12 | 17 | A | 2.4 | B | A | A |
| Example 96 | 175.7 | 119.4 | 2 | 12 | 17 | A | 2.6 | B | A | A |
| Example 97 | 172.6 | 110.0 | 4 | 20 | 20 | A | 1.5 | B | A | A |
| Example 98 | 146.0 | 99.5 | 3 | 20 | 15 | A | 1.9 | B | A | A |
| Example 99 | 170.4 | 95.1 | 0 | 20 | 0 | A | 2.0 | B | A | A |
| Example 100 | 177.7 | 117.2 | 1 | 20 | 5 | A | 1.7 | B | A | A |
| Example 101 | 164.0 | 107.5 | 2 | 20 | 10 | A | 1.4 | B | A | A |
| Example 102 | 181.0 | 108.3 | 1 | 20 | 5 | A | 1.6 | B | A | A |
| Example 103 | 173.5 | 107.5 | 1 | 20 | 5 | A | 1.5 | B | A | A |
| Example 104 | 169.9 | 102.4 | 0 | 20 | 0 | A | 1.9 | B | A | A |
| Example 105 | 162.0 | 87.3 | 0 | 20 | 0 | A | 2.2 | B | A | A |
| Example 106 | 152.6 | 75.6 | 3 | 12 | 25 | A | 1.2 | C | A | A |
| Example 107 | 147.3 | 80.5 | 3 | 12 | 25 | A | 1.1 | C | A | A |
| Example 108 | 146.9 | 81.6 | 3 | 12 | 25 | A | 1.3 | C | A | A |

TABLE 8

|  | Adhesion (N/2 mm□) | | Delamination resistance test | | | | Workability evaluation | | | |
|---|---|---|---|---|---|---|---|---|---|---|
|  | | | | | NG rate | | Stringing height | Disappearance | Resin paste | Spreading |
|  | 23° C. | 100° C. | NG count | Total count | (%) | Evaluation | (mm) | of protrusion | bridge | behavior |
| Example 109 | 164.1 | 99.2 | 3 | 12 | 25 | A | 3.4 | B | A | A |
| Example 110 | 157.1 | 97.1 | 2 | 12 | 17 | A | 3.8 | B | A | A |
| Example 111 | 159.5 | 95.0 | 3 | 12 | 25 | A | 3.6 | B | A | A |
| Example 112 | 171.5 | 90.4 | 3 | 12 | 25 | A | 3.2 | B | A | A |
| Example 113 | 168.1 | 95.3 | 1 | 12 | 8 | A | 3.1 | B | A | A |
| Example 114 | 169.5 | 97.7 | 1 | 12 | 8 | A | 3.8 | B | A | A |
| Example 115 | 169.9 | 88.5 | 3 | 12 | 25 | A | 3.9 | B | A | A |
| Example 116 | 164.8 | 91.7 | 0 | 12 | 0 | A | 4.1 | B | A | A |
| Example 117 | 163.5 | 93.7 | 1 | 12 | 8 | A | 3.5 | B | A | A |
| Comparative Example 1 | 40.0 | 33.7 | 12 | 12 | 100 | C | 0.0 | A | B | F |
| Comparative Example 2 | 40.4 | 35.6 | 11 | 12 | 92 | C | 0.0 | A | F | F |
| Comparative Example 3 | 38.8 | 33.9 | 12 | 12 | 100 | C | 5.0 | B | B | A |
| Comparative Example 4 | 39.1 | 32.2 | 11 | 12 | 92 | C | 4.7 | B | A | A |
| Comparative Example 5 | 41.3 | 29.9 | 11 | 12 | 92 | C | 3.6 | B | A | A |
| Comparative Example 6 | 42.9 | 30.7 | 12 | 12 | 100 | C | 1.8 | B | A | A |
| Comparative Example 7 | 37.9 | 31.7 | 12 | 12 | 100 | C | 1.3 | B | A | A |
| Comparative Example 8 | 46.9 | 35.2 | 3 | 12 | 25.0 | A | 5.0 | A | F | F |
| Reference Example 1 | 130.5 | 96.6 | 1 | 12 | 8 | A | 0.0 | A | A | F |
| Reference Example 2 | 135.4 | 96.7 | 2 | 12 | 17 | A | 3.4 | A | B | F |
| Reference Example 3 | 137.4 | 99.1 | 1 | 12 | 8 | A | 5.0 | B | F | A |

The following were confirmed from the results listed in Tables 5 to 8.

The curable compositions of Examples 1 to 117 exhibited excellent workability during application, and produced a cured product that exhibited excellent adhesion, excellent delamination resistance, and excellent heat resistance.

On the other hand, the curable composition of Comparative Example 1 that did not include fine particles exhibited inferior workability during application, and produced a cured product that exhibited inferior adhesion, inferior delamination resistance, and inferior heat resistance.

The curable composition of Comparative Example 8 that included fine particles having a large average primary particle size exhibited inferior workability during application.

The cured products obtained using the curable compositions of Comparative Examples 2 to 7 that did not include the component (C) exhibited inferior adhesion, inferior delamination resistance, and inferior heat resistance.

The invention claimed is:

1. A curable composition comprising a component (A), a component (B), and a component (C), the curable composition comprising the component (A) and the component (B) in a mass ratio (component (A):component (B)) of 100:0.3 to 100:50, the component (A) being a curable polysilsesquioxane compound that comprises a repeating unit represented by a formula (a-1), $$R^1SiO_{3/2} \quad (a\text{-}1)$$

wherein $R^1$ is a substituted or unsubstituted alkyl group having 1 to 10 carbon atoms, or a substituted or unsubstituted aryl group, the component (B) being fine particles having an average primary particle size of 5 to 40 nm, and the component (C) being a silane coupling agent that comprises a sulfur atom in its molecule.

2. The curable composition according to claim 1, wherein the curable polysilsesquioxane compound that is used as the component (A) has a mass average molecular weight (Mw) of 800 to 30,000.

3. The curable composition according to claim 1, wherein the curable polysilsesquioxane compound that is used as the component (A) is a curable polysilsesquioxane compound obtained by subjecting at least one compound represented by a formula (a-2) to polycondensation in the presence of a polycondensation catalyst, $$R^1Si(OR^2)_x(X^1)_{3-x} \quad (a\text{-}2)$$

wherein $R^1$ is the same as defined above, $R^2$ is an alkyl group having 1 to 10 carbon atoms, $X^1$ is a halogen atom, and x is an integer from 0 to 3, provided that a plurality of $R^2$ are either identical to or different from each other when a plurality of $R^2$ are present, and a plurality of $X^1$ are either identical to or different from each other when a plurality of $X^1$ are present.

4. The curable composition according to claim 1, wherein the component (B) is at least one type of fine particles selected from a group consisting of silica, a metal oxide, and a mineral.

5. The curable composition according to claim 1, comprising the component (A) and the component (C) in a mass ratio (component (A):component (C)) of 100:0.1 to 100:50.

6. The curable composition according to claim 1, further comprising a diluent.

7. The curable composition according to claim 6, comprising the component (A), the component (B), and the component (C) in a total ratio of 50 to 100 mass % based on a total amount of components included in the curable composition excluding the diluent.

8. The curable composition according to claim 6, having a solid content of 50 mass % or more and less than 100 mass %.

9. A method for producing the curable composition according to claim 1, comprising:

a step (I) that subjects at least one compound represented by a formula (a-2) to polycondensation in the presence of a polycondensation catalyst to obtain the curable polysilsesquioxane compound, $$R^1Si(OR^2)_x(X^1)_{3-x} \quad (a\text{-}2)$$

wherein $R^1$ is the same as defined above, $R^2$ is an alkyl group having 1 to 10 carbon atoms, $X^1$ is a halogen atom, and x is an integer from 0 to 3, provided that a plurality of $R^2$ are either identical to or different from each other when a plurality of $R^2$ are present, and a plurality of $X^1$ are either identical to or different from each other when a plurality of $X^1$ are present; and a step (II) that mixes the curable polysilsesquioxane compound obtained by the step (I), the component (B), and the component (C).

10. A cured product obtained by curing the curable composition according to claim 1.

11. The cured product according to claim 10, the cured product being an optical element-securing material.

12. A method for using the curable composition according to claim 1 as an optical element-securing adhesive.

13. A method for using the curable composition according to claim 1 as an optical element sealing material.

14. An optical device produced using the curable composition according to claim 1 as an optical element-securing adhesive or an optical element sealing material.

* * * * *